US009177756B2

(12) United States Patent
Holland et al.

(10) Patent No.: US 9,177,756 B2
(45) Date of Patent: Nov. 3, 2015

(54) E-BEAM ENHANCED DECOUPLED SOURCE FOR SEMICONDUCTOR PROCESSING

(75) Inventors: John Patrick Holland, San Jose, CA (US); Peter L. G. Ventzek, San Francisco, CA (US); Harmeet Singh, Eindhoven (NL); Jun Shinagawa, San Jose, CA (US); Akira Koshiishi, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 663 days.

(21) Appl. No.: 13/357,003

(22) Filed: Jan. 24, 2012

(65) Prior Publication Data

US 2012/0258601 A1  Oct. 11, 2012

Related U.S. Application Data

(63) Continuation-in-part of application No. 13/084,325, filed on Apr. 11, 2011, and a continuation-in-part of application No. 13/104,923, filed on May 10, 2011, now Pat. No. 8,900,402.

(60) Provisional application No. 61/555,639, filed on Nov. 4, 2011.

(51) Int. Cl.
*H01L 21/3065* (2006.01)
*C23F 1/00* (2006.01)
*H01J 37/04* (2006.01)
*H01J 37/32* (2006.01)

(52) U.S. Cl.
CPC ........... *H01J 37/04* (2013.01); *H01J 37/32018* (2013.01); *H01J 37/32357* (2013.01); *H01J 37/32596* (2013.01)

(58) Field of Classification Search
USPC .................................................... 156/345.4
See application file for complete search history.

(56) References Cited

U.S. PATENT DOCUMENTS

| 4,382,186 | A |   | 5/1983 | Denholm et al. |
|-----------|---|---|--------|----------------|
| 5,102,496 | A | * | 4/1992 | Savas .............................. 216/69 |
| 5,342,448 | A | * | 8/1994 | Hamamura et al. ..... 118/723 FI |

(Continued)

OTHER PUBLICATIONS

D. Söderström et al., "Time Evolution of the Space-Charge Sheath in an RF Hollow Cathode", Journal of Physics: Conference Series 100 (2008) 062020, pp. 5 total.

(Continued)

*Primary Examiner* — Joseph Schoenholtz
(74) *Attorney, Agent, or Firm* — Martine Penilla Group, LLP

(57) ABSTRACT

A semiconductor substrate processing system includes a processing chamber and a substrate support defined to support a substrate in the processing chamber. The system also includes a plasma chamber defined separate from the processing chamber. The plasma chamber is defined to generate a plasma. The system also includes a plurality of fluid transmission pathways fluidly connecting the plasma chamber to the processing chamber. The plurality of fluid transmission pathways are defined to supply reactive constituents of the plasma from the plasma chamber to the processing chamber. The system further includes an electrode disposed within the processing chamber separate from the substrate support. The system also includes a power supply electrically connected to the electrode. The power supply is defined to supply electrical power to the electrode so as to liberate electrons from the electrode into the processing chamber.

19 Claims, 18 Drawing Sheets

(56) References Cited

U.S. PATENT DOCUMENTS

| | | | |
|---|---|---|---|
| 5,368,676 A * | 11/1994 | Nagaseki et al. | 156/345.38 |
| 5,451,290 A * | 9/1995 | Salfelder | 216/67 |
| 5,604,401 A | 2/1997 | Makishima | |
| 5,656,141 A | 8/1997 | Betz et al. | |
| 5,942,854 A | 8/1999 | Ryoji et al. | |
| 6,127,275 A | 10/2000 | Flamm | |
| 6,217,704 B1 * | 4/2001 | Kitagawa | 156/345.33 |
| 6,348,158 B1 | 2/2002 | Samukawa | |
| 6,368,678 B1 | 4/2002 | Bluck et al. | |
| 6,435,131 B1 * | 8/2002 | Koizumi | 118/723 ME |
| 6,656,540 B2 * | 12/2003 | Sakamoto et al. | 427/564 |
| 6,787,010 B2 | 9/2004 | Cuomo et al. | |
| 7,094,315 B2 | 8/2006 | Chen et al. | |
| 7,632,379 B2 | 12/2009 | Goto et al. | |
| 7,872,406 B2 | 1/2011 | Matacotta | |
| 8,387,562 B2 * | 3/2013 | Kikuchi et al. | 118/723 E |
| 2004/0163763 A1 | 8/2004 | Martin et al. | |
| 2005/0105580 A1 | 5/2005 | Giapis et al. | |
| 2006/0042752 A1 | 3/2006 | Rueger | |
| 2006/0042755 A1 | 3/2006 | Holmberg et al. | |
| 2006/0054279 A1 | 3/2006 | Kim et al. | |
| 2007/0017636 A1 * | 1/2007 | Goto et al. | 156/345.47 |
| 2007/0034497 A1 | 2/2007 | Chistyakov | |
| 2007/0254112 A1 * | 11/2007 | Takehara et al. | 427/569 |
| 2007/0281105 A1 | 12/2007 | Mokhlesi et al. | |
| 2008/0008640 A1 | 1/2008 | Watanabe et al. | |
| 2008/0135518 A1 | 6/2008 | Chen et al. | |
| 2009/0061640 A1 | 3/2009 | Wong et al. | |
| 2009/0145554 A1 * | 6/2009 | Weichart et al. | 156/345.35 |
| 2009/0218212 A1 | 9/2009 | Denpoh et al. | |
| 2009/0272718 A1 * | 11/2009 | Fischer | 216/37 |
| 2010/0006226 A1 * | 1/2010 | Cho et al. | 156/345.33 |
| 2010/0068870 A1 | 3/2010 | Ovshinsky | |
| 2010/0184299 A1 | 7/2010 | Takahashi | |
| 2010/0221922 A1 | 9/2010 | Rueger et al. | |
| 2010/0267247 A1 | 10/2010 | Ma et al. | |
| 2011/0005681 A1 | 1/2011 | Savas et al. | |
| 2011/0053381 A1 | 3/2011 | Kobayashi et al. | |
| 2011/0177644 A1 * | 7/2011 | Yamamuka et al. | 438/57 |
| 2011/0272097 A1 * | 11/2011 | Koshiishi et al. | 156/345.24 |
| 2012/0190207 A1 * | 7/2012 | Nishimura et al. | 438/710 |
| 2013/0098872 A1 * | 4/2013 | Dorf et al. | 216/67 |

OTHER PUBLICATIONS

H.S. Lee et al., "Effective Design of Multiple Hollow Cathode Electrode to Enhance the Density of RF Capacitively Coupled Plasma", Applied Physics Letters 97, 081503 (2010), © 2010 American Institute of Physics, pp. 3 total.

Thomas Deconinck et al., "Modeling of Mode Transition Behavior in Argon Microhollow Cathode Discharges", Plasma Processes and Polymers, 2009, 6, pp. 335-346.

Kazunori Koga et al., "Highly Stable a-Si:H Films Deposited by Using Multi-Hollow Plasma Chemical Vapor Deposition", © 2005 Japanese Journal of Applied Physics, vol. 44, No. 48, pp. L1430-L1432.

Shiratani et al., Journal of Physics: Conference Series 86 (2007) 012021.

* cited by examiner

View A-A

View A-A

View A-A

View A-A

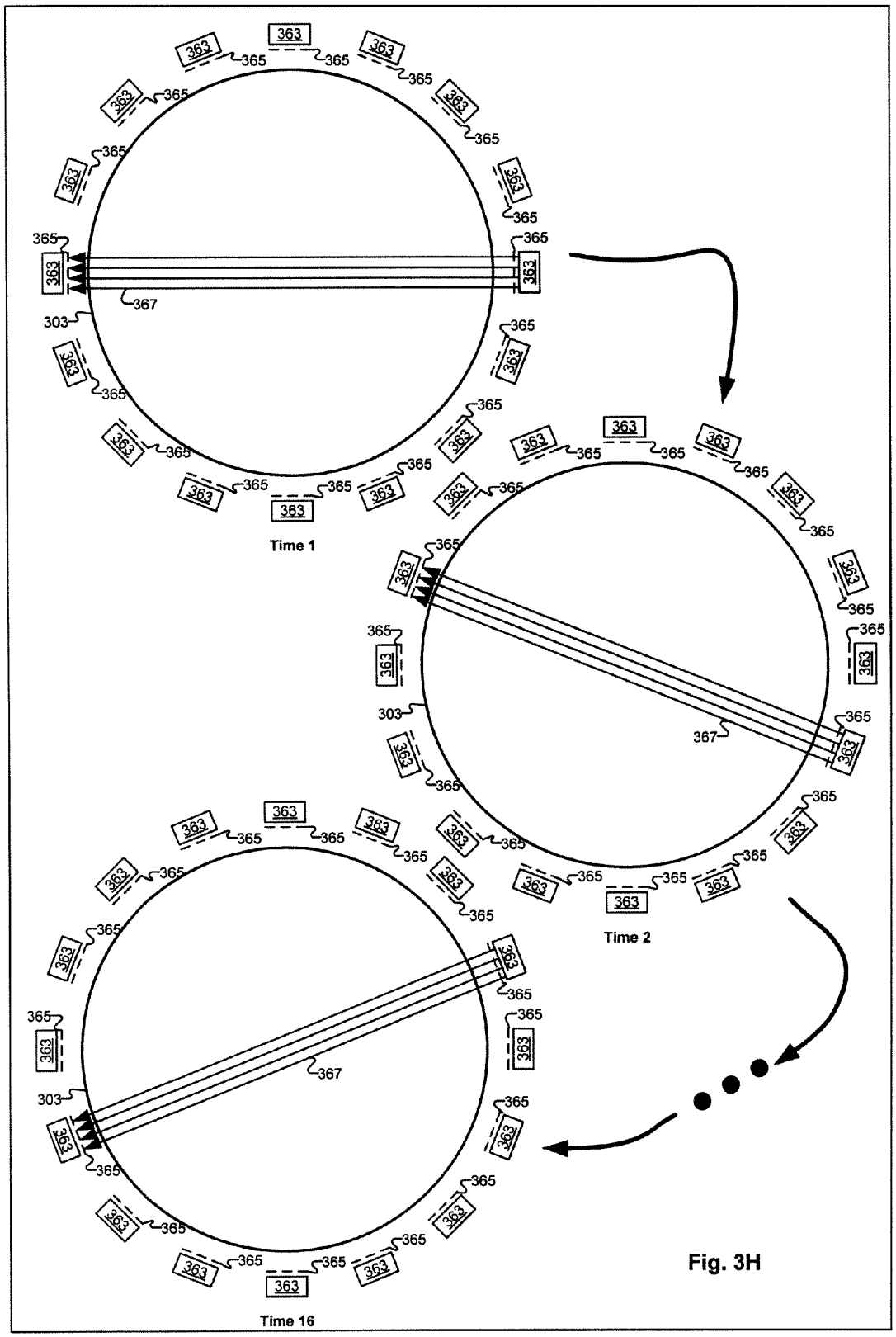

E-BEAM ENHANCED DECOUPLED SOURCE FOR SEMICONDUCTOR PROCESSING

CLAIM OF PRIORITY

This application claims priority under 35 U.S.C. 119(e) to U.S. Provisional Patent Application No. 61/555,639, filed Nov. 4, 2011, entitled "E-Beam Enhanced Decoupled Source for Semiconductor Processing," the disclosure of which is incorporated herein by reference in its entirety. This application is also a continuation-in-part application under 35 U.S.C. 120 of prior U.S. application Ser. No. 13/084,325, filed Apr. 11, 2011, and entitled "Multi-Frequency Hollow Cathode and Systems Implementing the Same." This application is also a continuation-in-part application under 35 U.S.C. 120 of prior U.S. application Ser. No. 13/104,923, filed May 10, 2011, now U.S. Pat. No. 8,900,402 and entitled "Semiconductor Processing System Having Multiple Decoupled Plasma Sources." The above-identified patent applications are incorporated herein by reference in their entirety.

CROSS-REFERENCE TO RELATED APPLICATIONS

This application is related to U.S. patent application Ser. No. 13/356,962, filed on an even date herewith, and entitled "E-Beam Enhanced Decoupled Source for Semiconductor Processing," which is incorporated herein by reference in its entirety. This application is also related to U.S. patent application Ser. No. 13/357,044, filed on an even date herewith, and entitled "E-Beam Enhanced Decoupled Source for Semiconductor Processing," which is incorporated herein by reference in its entirety.

BACKGROUND OF THE INVENTION

Plasma sources utilized for thin film processing in semiconductor device fabrication are often unable to achieve the most desirable condition for dry etching due to the inability to separately control ion and radical concentrations in the plasma. For example, in some applications, the desirable conditions for plasma etching would be achieved by increasing the ion concentration in the plasma while simultaneously maintaining the radical concentration at a constant level. However, this type of independent ion concentration versus radical concentration control cannot be achieved using the common plasma source typically used for thin film processing. It is within this context that the present invention arises.

SUMMARY OF THE INVENTION

In one embodiment, a semiconductor substrate processing system is disclosed. The system includes a processing chamber and a substrate support defined to support a substrate in the processing chamber. The system also includes a plasma chamber defined separate from the processing chamber. The plasma chamber is defined to generate a plasma. The system also includes a plurality of fluid transmission pathways fluidly connecting the plasma chamber to the processing chamber. The plurality of fluid transmission pathways are defined to supply reactive constituents of the plasma from the plasma chamber to the processing chamber. The system further includes an electrode disposed within the processing chamber separate from the substrate support. A power supply is electrically connected to the electrode. The power supply is defined to supply electrical power to the electrode so as to liberate electrons from the electrode into the processing chamber.

In one embodiment, a method is disclosed for processing a semiconductor substrate, in accordance with one embodiment of the present invention. The method includes an operation for placing a substrate on a substrate support in exposure to a processing region. The method also includes an operation for generating a plasma in a plasma generation region separate from the processing region. The method also includes an operation for supplying reactive constituents of the plasma from the plasma generation region to the processing region. The method further includes an operation for supplying power to one or more electrodes disposed within the processing region separate from the substrate support. The power supplied to the one or more electrodes injects electrons from the one or more electrodes into the processing region so as to modify an ion density in the processing region to affect processing of the substrate.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 3H shows a rasterized temporal sequence for operation of the multiple electron beam sources of FIG. 3G, in accordance with one embodiment of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Plasma sources utilized for thin film semiconductor processing are often unable to achieve the most desirable condition for dry etching due to the inability to separately adjust ion and radical concentrations in the plasma. In many applications, the desirable conditions for plasma etching would be achieved by increasing the ion concentrations, while at the same time maintaining the radical concentration at a substantially constant level. However, it is difficult at best to achieve this type of adjustment through conventional plasma sources that are used for thin film processing.

The concept of providing separate control of ion concentration and radical concentration in a semiconductor processing plasma is referred to herein as providing a decoupled ion/radical plasma source. One concept for providing the decoupled ion/radical plasma source is to inject radicals and ions from separate plasma sources. In various embodiments, these separate plasma sources can be either spatially separated or temporally separated, i.e., defined to generate primarily ion or primarily radicals at different times. Examples of decoupled ion/radical plasma sources that utilize spatial separation, temporal separation, or a combination thereof are described in co-pending U.S. patent application Ser. No. 13/104,923, filed on May 10, 2011, entitled "Semiconductor Processing System Having Multiple Decoupled Plasma Sources."

Figure 1:
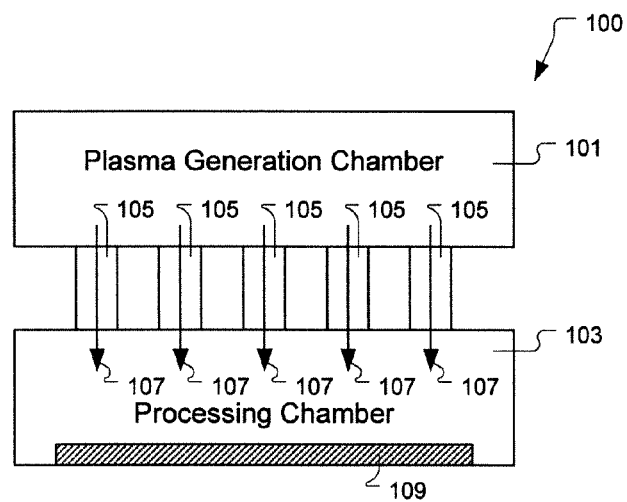
FIG. 1 shows a simplified schematic of a semiconductor substrate processing system that utilizes a plasma chamber defined separate from a substrate processing chamber, in accordance with one embodiment of the present invention.

A plasma-driven substrate processing system that relies upon radical species of a plasma to provide some processing of the semiconductor substrate may generate the plasma in a plasma chamber separate from the substrate processing chamber due to differences between the environmental requirements, i.e., pressure, temperature, gas composition, gas flow rate, power supply, of the plasma chamber and the substrate processing chamber. FIG. 1 shows a simplified schematic of a semiconductor substrate processing system 100 that utilizes a plasma chamber 101 defined separate from a substrate processing chamber 103, in accordance with one embodiment of the present invention. In the system 100, the plasma generation chamber 101 is fluidly connected to the substrate processing chamber 103 by a number of fluid transmission pathways 105. In this manner, the reactive species of the plasma generated within the plasma generation chamber 101 travel through the fluid transmission pathways 105 into the substrate processing chamber 103, as indicated by arrows 107. In one embodiment, some of the fluid transmission pathways 105 are defined to include an energizable region defined to provide supplemental electron generation to increase ion extraction from the plasma generation chamber 355. Upon entering the substrate processing chamber 103, the reactive species of the plasma interact with a substrate 109 so as to process the substrate 109 in a prescribed manner.

In one embodiment, the term "substrate" as used herein refers to a semiconductor wafer. However, it should be understood that in other embodiments, the term "substrate" as used herein can refer to substrates formed of sapphire, GaN, GaAs or SiC, or other substrate materials, and can include glass panels/substrates, metal foils, metal sheets, polymer materials, or the like. Also, in various embodiments, the "substrate" as referred to herein may vary in form, shape, and/or size. For example, in some embodiments, the "substrate" as referred to herein may correspond to a 200 mm (millimeters) semiconductor wafer, a 300 mm semiconductor wafer, or a 450 mm semiconductor wafer. Also, in some embodiments, the "substrate" as referred to herein may correspond to a non-circular substrate, such as a rectangular substrate for a flat panel display, or the like, among other shapes. The "substrate" referred to herein is denoted in the various example embodiment figures as substrate 109.

In most plasma processing applications, it is desirable to utilize both ion species and radical species of the plasma to process the substrate 109. Because radical species are electrically neutral, the radical species can travel from the plasma generation chamber 101 through the fluid transmission pathways 105 to the substrate processing chamber 103 in conjunction with a flow of process gas. However, because ion species are electrically charged and can be electrically neutralized upon contact with a material surface, it can be difficult to achieve a controlled and efficient transfer of ions from the plasma generation chamber 101 through the fluid transmission pathways 105 to the substrate processing chamber 103.

It should be appreciated that injection of ions from a remote source to a substrate processing region can be problematic. As mentioned above, if the ion source is spatially separate from the substrate processing region, the ions must be transported through a conveyance means between the ion source and the substrate processing region. In different embodiments, the conveyance means can be defined in many different ways. For example, in one embodiment, the ion source is generated in a chamber physically separate from the substrate processing chamber and the conveyance means is defined by an array of tubes. In another embodiment, a chamber for generating the ion source is separated from the substrate processing chamber by a plate assembly, and the conveyance means is defined by a number of through-holes formed through the plate assembly. It should be understood that the above-mentioned examples of the conveyance means are provided by way example only. In other embodiments, the conveyance means can be defined in other ways, so long as the conveyance means provides one or more fluid transmission pathways between a region in which the ion/radical source, i.e., plasma, is generated and the substrate processing region.

At best, an ion flux achievable in a secondary substrate processing chamber is a product of an ion density in an ion source region and the Bohm velocity, where the Bohm velocity represents the speed of ions at an edge of a surface sheath in the ion source region. The surface sheath represents a region in front of a material surface that is in contact with the ion source plasma and that is in the presence of an electric field. The total number of ions available to the substrate processing chamber per unit time is then the product of the ion flux in the ion source region, i.e., in the plasma generation chamber, multiplied by a total flow area of the conveyance means (fluid transmission pathways) between the ion source region and the substrate processing chamber.

A balance equation exists in which an extra ion flux to the walls in the plasma processing chamber due to ions injected from the ion source region is equal to the ion flux injected from the ion source region through the conveyance means, as follows:

$$n_{upper} = \frac{\Delta n}{\left(\frac{v_{bohm\_upper} A_{open}}{v_{bohm\_lower} A_{loss\_lower}}\right)}. \qquad \text{Equation 1}$$

where $n_{upper}$=number density of ions in ion source region, $\Delta n$=addition to number density of ions in substrate processing chamber from ion source region, $v_{bohm\_upper}$=Bohm velocity of ions in ion source region, $A_{open}$=total area of conveyance means between ion source region and substrate processing chamber, $A_{bohm\_lower}$=total area of walls of substrate processing chamber, and $v_{bohm\_lower}$=Bohm velocity of ions in substrate processing chamber.

The Bohm velocity is given by Equation 2.

$$v_{bohm} = \left(\frac{9.8E5 \, T_e}{m_i}\right)^{1/2} \text{cm/sec.} \qquad \text{Equation 2}$$

where $v_{bohm}$=Bohm velocity of ion, $T_e$=temperature of ion (eV), and $m_i$=mass of ion (amu).

According to Equation 1, maximizing the ion density in the substrate processing chamber can be accomplished by one or more of the following: 1) increasing the number density of ions in the ion source region, i.e., increasing $n_{upper}$, 2) increasing the electron temperature in the ion source, i.e., increasing $V_{bohm\_upper}$, and 3) minimizing ion losses in the conveyance means between the ion source and the substrate processing chamber.

A total flow area of the conveyance means between the ion source region and the substrate processing chamber can be quite small. For example, small tube diameters or a small numbers of holes of small diameter may be needed to maintain an adequate pressure differential between the higher pressure ion source region and the lower pressure substrate processing chamber. Therefore, because large gas densities, i.e., high gas pressures, may be needed in the ion source region to achieve a sufficient amount of electron production, it may not be feasible to simply increase the flow area of the conveyance means between the ion source region and the substrate processing chamber.

Figure 2:
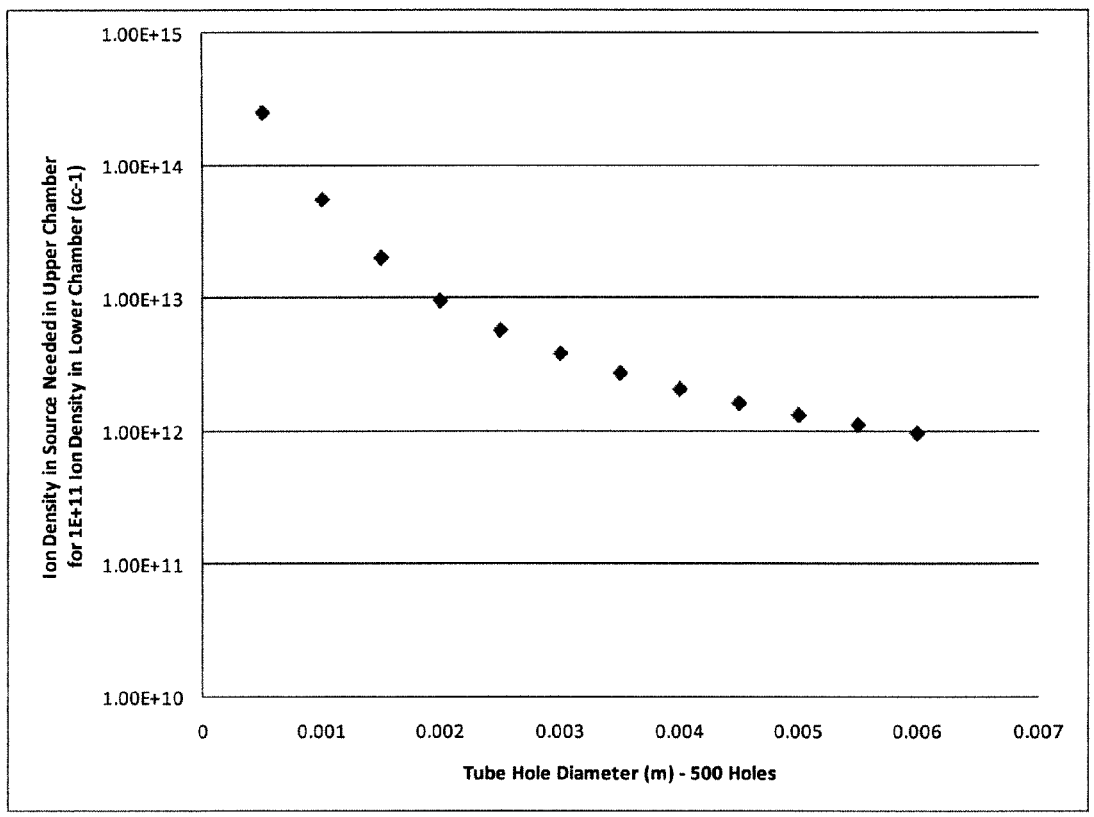
FIG. 2 shows a plot of ion density in the ion source region needed to obtain a 1.0E11 $cc^{-1}$ ion density in the substrate processing chamber as a function of tube hole diameter, where the tubes represent the conveyance means between the ion source region and the substrate processing chamber, in accordance with one embodiment of the present invention.

Additionally, it can be difficult to increase the ion number density and electron temperature in the ion source region to the degree needed to compensate for the small flow area of the conveyance means between the ion source region and the substrate processing chamber. FIG. 2 shows a plot of ion density in the ion source region needed to obtain a 1.0E11 $cc^{-1}$ ion density in the substrate processing chamber as a function of tube hole diameter, where the tubes represent the conveyance means between the ion source region and the substrate processing chamber, in accordance with one embodiment of the present invention. As shown in FIG. 2, if ion densities of 1.0E11 $cc^{-1}$ were needed above the substrate in the substrate processing chamber, it may be necessary to have an ion density in the ion source region on the order of 1.0E12 $cc^{-1}$. Achieving an ion density level on the order of 1.0E11 cc-1 in the substrate processing chamber with a tube conveyance means having a diameter less than 2 mm (millimeters) may be possible in very specialized and often impractical circumstances.

An additional issue for separately controlling ion flux and radical flux in the substrate processing chamber is generating an ion flux in the presence of low electron temperature, particularly when the substrate processing chamber is operated at low pressure. For example, it may be difficult to generate an ion flux in a process that requires minimum "damage" to the substrate by maintaining an ultra low electron temperature in exposure to the substrate, such as in an atomic layer etching (ALE) process, which is an atomic layer deposition process that forms epitaxial layer on the substrate. By way of example, consider an ALE process in which a thin film was deposited at low electron temperature, followed by a processing step to remove a monolayer of material which requires higher electron temperature. In this example, it may be difficult to adjust the ion flux to accomplish the monolayer removal process step given the low electron temperature of the preceding ALE process step.

It should be understood that having an ability to control the electron energy distribution function (EEDF) in the substrate processing chamber is itself a means of providing separate (decoupled) control of ion density relative to radical density within the substrate processing chamber. More specifically, having an ability to control the EEDF to "select" families of electrons that avoid low energy dissociation processes, and favor higher energy ionization or dissociative ionization processes, can increase the ion flux relative to the radical flux within the substrate processing chamber, or can increase the ion flux relative to the flux of unbeneficial radicals within the substrate processing chamber.

Several plasma-driven substrate processing system embodiments are disclosed herein to provide for adequate and large ion flux in plasma sources that exploit multiplexed ion and radical sources for ion and radical control. The plasma-driven substrate processing system embodiments disclosed herein also provide for achieving large ion flux with non-damaging ion and electron energies in applications that may require such large ion flux, such as ALE.

Electron beam injection into the substrate processing chamber acts to lower the "bulk" electron temperature and plasma potential through charge addition. Therefore, the EEDF within the substrate processing chamber can be modified through electron beam injection. More specifically, electron beam injection into the substrate processing region has the effect of dropping the rate of low energy electron impact processes, e.g., dissociative electron impact processes. At electron energies above about 100 eV (electronvolts), electron interaction processes that include charged particle production have much larger cross-sections than electron interaction processes without charged particle production. Therefore, the family of high-energy electrons or beam-injected electrons can sustain the plasma discharge through high-energy electron interaction processes. The plasma-driven substrate processing system embodiments disclosed herein implement various types of electron injection technology to maximize the ion flux available to a substrate and to provide for decoupling of ion and radical flux control within the substrate processing chamber.

Figure 3A:
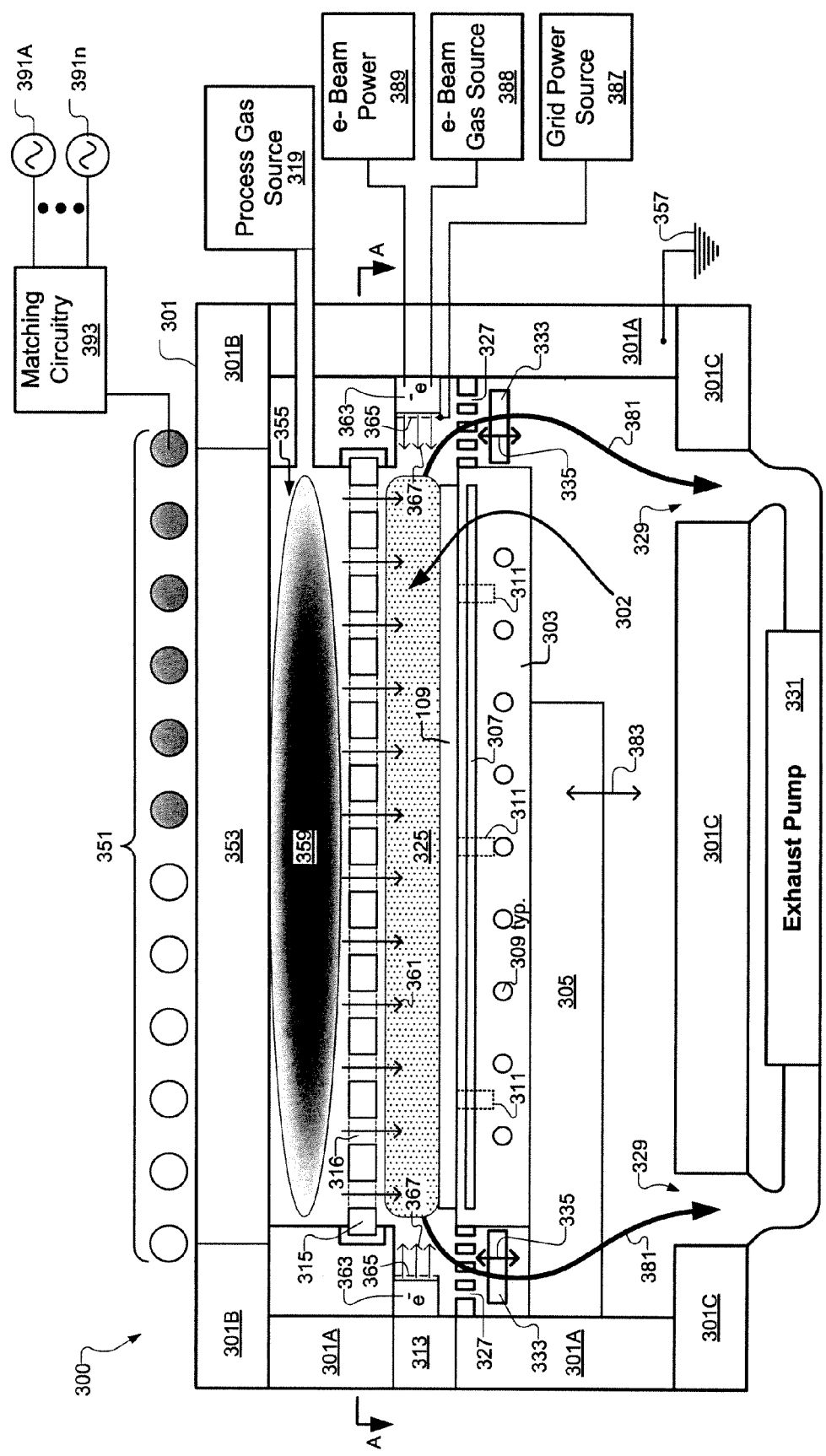
FIG. 3A shows a vertical cross-section of a plasma-driven substrate processing system, in accordance with one embodiment of the present invention.

FIG. 3A shows a vertical cross-section of a plasma-driven substrate processing system 300, in accordance with one embodiment of the present invention. The system 300 includes a chamber 301 formed by a top structure 301B, a bottom structure 301C, and sidewalls 301A extending between the top structure 301B and bottom structure 301C. The chamber 301 encloses a substrate processing region 302 in which the substrate 109 is held in a secured manner on a substrate support 303 and is exposed to reactive constituents 325 of a plasma 359. The substrate processing region 302 is separated from a plasma generation chamber 355 by a top plate 315. During operation, the reactive constituents 325 of the plasma 359 travel through a number of fluid transmission pathways 316 within the top plate 315 to reach the substrate processing region 302, as indicated by arrows 361.

In various embodiments, the chamber sidewalls 301A, top structure 301B, and bottom structure 301C can be formed from different materials, such as stainless steel or aluminum, by way of example, so long as the chamber 301 materials are structurally capable of withstanding pressure differentials and temperatures to which they will be exposed during plasma processing, and are chemically compatible with the plasma processing environment. Also, in one embodiment, the chamber sidewalls 301A, top structure 301B, and bottom structure 301C are formed of an electrically conductive material, and are electrically connected to an electrical ground 357.

In the embodiment of FIG. 3A, the plasma generation chamber 355 is formed above the top plate 315. The plasma generation chamber 355 is in fluid communication with both a process gas source 319 and each of the fluid transmission pathways 316 through the top plate 315. The system 300 also includes a coil assembly 351 disposed to transform the process gas within the plasma generation chamber 355 into the plasma 359. In the system 300, the chamber top plate 301B includes a window 353 that is suitable for transmission of RF (radiofrequency) power from the coil assembly 351 into the plasma generation chamber 355. In one embodiment, the window 353 is formed from quartz. In another embodiment, the window 353 is formed from a ceramic material, such as silicon carbide.

In one embodiment, RF power is delivered to the coil assembly 351 from one or more RF power sources 391A-391n. Each RF power source 391A-391n is connected through respective matching circuitry 393 to ensure efficient RF power transmission to the coil assembly 351. In the case of multiple RF power sources 391A-391n, it should be understood that each of the multiple RF power sources 391A-391n can be independently controlled with regard to RF power frequency and/or amplitude. In one embodiment, the one or more RF power source 391A-391n are defined to supply RF power having a frequency of either 2 MHz, 27 MHz, 60 MHz, 400 kHz, or a combination thereof.

It should be understood that the inductive power delivery system of FIG. 3A is shown by way of example. In other embodiments, the plasma generation chamber 355 can be defined to generate the plasma 359 in different ways. For example, in one embodiment, the plasma generation chamber 355 can be defined as a capacitively coupled chamber, in which the plasma 359 generation region of the chamber 355 is exposed to a pair of spaced apart electrodes that are electrically connected to one or more power supplies, such that power (either direct current (DC), RF, or a combination thereof) is transmitted between the pair of electrodes and through the chamber 355, so as to transform the process gas delivered from the process gas source 319 into the plasma 359. In yet another embodiment, the plasma generation chamber 355 can be defined as a microwave-driven chamber.

Regardless of the particular power delivery embodiment for generation of the plasma 359, it should be understood that during operation of the system 300, process gases supplied by the process gas source 319 are transformed into the plasma 359 within the plasma generation chamber 355. As a result, reactive constituents 325 of the plasma 359 move from the plasma generation chamber 355, through the number fluid transmission pathways 316 of the top plate 315, to the substrate processing region 302 over the substrate support 303, and onto the substrate 109 when disposed on the substrate support 303.

In one embodiment, upon entering the substrate processing region 302 from the fluid transmission pathways 316 of the top plate 315, the process gases flow through peripheral vents 327, and are pumped out through exhaust ports 329 by an exhaust pump 331, as indicated by arrows 381. In one embodiment, a flow throttling device 333 is provided to control a flow rate of the process gases from the substrate processing region 302. Also, in one embodiment, the flow throttling device 333 is defined as a ring structure that is movable toward and away from the peripheral vents 327, as indicated by arrows 335.

In one embodiment, the plasma generation chamber 355 is defined to operate at internal pressure up to about one Torr (T). Also, in one embodiment, the substrate processing region 302 is operated within a pressure range extending from about 1 milliTorr (mT) to about 100 mT. For example, in one embodiment, the system 300 is operated to provide a substrate processing region 302 pressure of about 10 mT, with a process gas throughput flow rate of about 1000 scc/sec (standard cubic centimeters per second), and with a residence time of the reactive constituents 325 within the substrate processing region 302 of about 10 milliseconds (ms). It should be understood and appreciated that the above example operating conditions represent one of an essentially limitless number of operating conditions that can be achieved with the system 300. The above example operating conditions do not represent or imply any limitation on the possible operating conditions of the system 300.

The substrate support 303 is disposed to support the substrate 109 in exposure to the substrate processing region 302. The substrate support 303 is defined to hold the substrate 109 thereon during performance of plasma processing operations on the substrate 109. In the example embodiment of FIG. 3A, the substrate support 303 is held by a cantilevered arm 305 affixed to a wall 301A of the chamber 301. However, in other embodiments, the substrate support 303 can be affixed to the bottom plate 301C of the chamber 301 or to another member disposed within the chamber 301. In various embodiments, the substrate support 303 can be formed from different materials, such as stainless steel, aluminum, or ceramic, by way of example, so long as the substrate support 303 material is structurally capable of withstanding pressure differentials and temperatures to which it will be exposed during plasma processing, and is chemically compatible with the plasma processing environment.

In one embodiment, the substrate support 303 includes a bias electrode 307 for generating an electric field to attract ions toward the substrate support 303, and thereby toward the substrate 109 held on the substrate support 303. More specifically, the electrode 307 within the substrate support 303 is defined to apply a bias voltage across the substrate processing region 302 between the substrate support 303 and the top plate 315. The bias voltage generated by the electrode 307 serves to pull ions that are formed within the plasma generation chamber 355 through the fluid transmission pathways 316 into the substrate processing region 302 and toward the substrate 109.

In one embodiment, the substrate support 303 includes a number of cooling channels 309 through which a cooling fluid can be flowed during plasma processing operations to maintain temperature control of the substrate 109. Also, in one embodiment, the substrate support 303 can include a number of lifting pins 311 defined to lift and lower the substrate 109 relative to the substrate support 303. In one embodiment, a door assembly 313 is disposed within the chamber wall 301A to enable insertion and removal of the substrate 109 into/from the chamber 301. Additionally, in one embodiment, the substrate support 303 is defined as an electrostatic chuck equipped to generate an electrostatic field for holding the substrate 109 securely on the substrate support 303 during plasma processing operations.

The top plate 315 is disposed within the chamber 301 above and spaced apart from the substrate support 303, so as to be positioned above and spaced apart from the substrate 109 when positioned on the substrate support 303. The substrate processing region 302 exists between the top plate 315 and the substrate support 303, so as to exist over the substrate 109 when positioned on the substrate support 303.

In one embodiment, the substrate support 303 is movable in a vertical direction, as indicated by arrows 383, such that a process gap distance as measured perpendicularly across the substrate processing region 302 between the top plate 315 and substrate support 303 is adjustable within a range extending from about 1 cm to about 10 cm. In one embodiment, the substrate support 303 is adjusted to provide a process gap distance of about 5 cm. Also, in one embodiment, a vertical position of the substrate support 303 relative to the top plate 315, vice-versa, is adjustable either during performance of a plasma processing operation or between plasma processing operations.

Adjustment of the process gap distance provides for adjustment of a dynamic range of the ion flux emanating from the fluid transmission pathways 316. Specifically, the ion flux that reaches the substrate 109 can be decreased by increasing the process gap distance, vice versa. In one embodiment, when the process gap distance is adjusted to achieve an adjustment in the ion flux at the substrate 109, the process gas flow rate through the plasma generation chamber 355 can be correspondingly adjusted, thereby providing a level of independence in the control of radical flux at the substrate 109. Additionally, it should be appreciated that the process gap distance in combination with the ion and radical fluxes emanating from the fluid transmission pathways 316 into the substrate processing region 302 are controlled to provide for a substantially uniform ion density and radical density at and across the substrate 109.

Figure 3B:
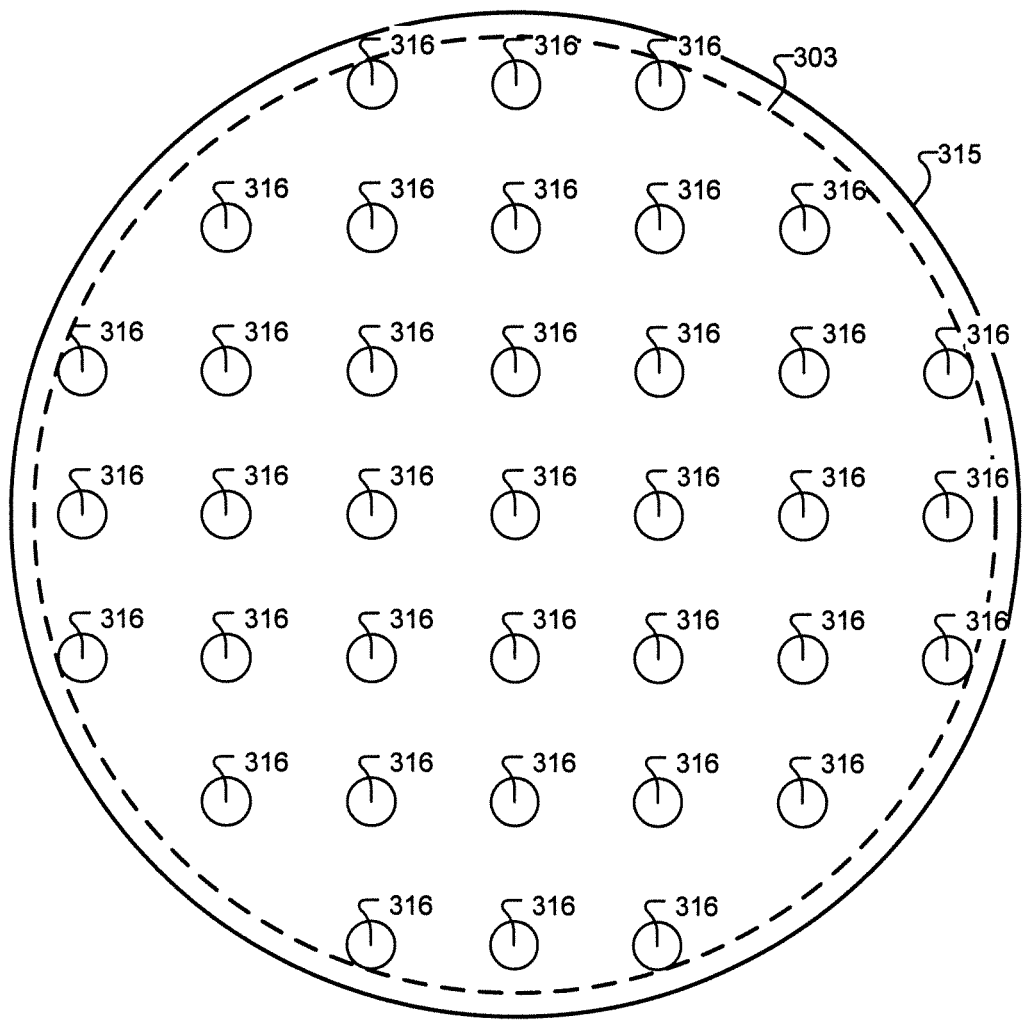
FIG. 3B shows a horizontal cross-section view A-A as referenced in FIG. 3A, in accordance with one embodiment of the present invention.

It should be appreciated that the configuration of fluid transmission pathways 316 through the top plate 315 can influence how the reactive constituents 325 of the plasma 359 are distributed within the substrate processing region 302. In one embodiment, the fluid transmission pathways 316 are formed through the top plate 315 in a substantially uniformly distributed manner relative to the underlying substrate support 303. FIG. 3B shows a horizontal cross-section view A-A as referenced in FIG. 3A, in accordance with one embodiment of the present invention. As shown in FIG. 3B, the fluid transmission pathways 316 are formed through the top plate 315 in a substantially uniformly distributed manner relative to the underlying substrate support 303.

Figure 3C:
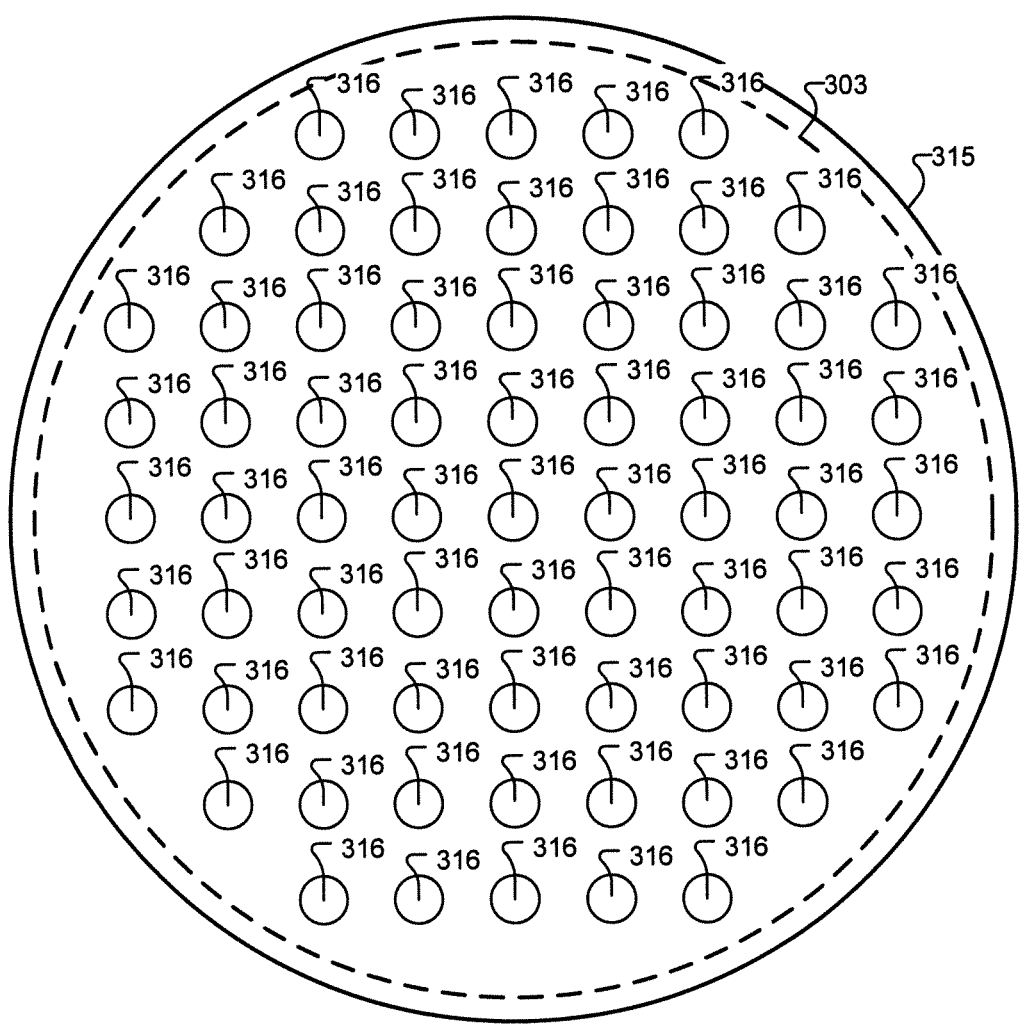
FIG. 3C shows a variation of the horizontal cross-section view of FIG. 3B in which the spacing between the fluid transmission pathways across the top plate is decreased, in accordance with one embodiment of the present invention.
Figure 3D:
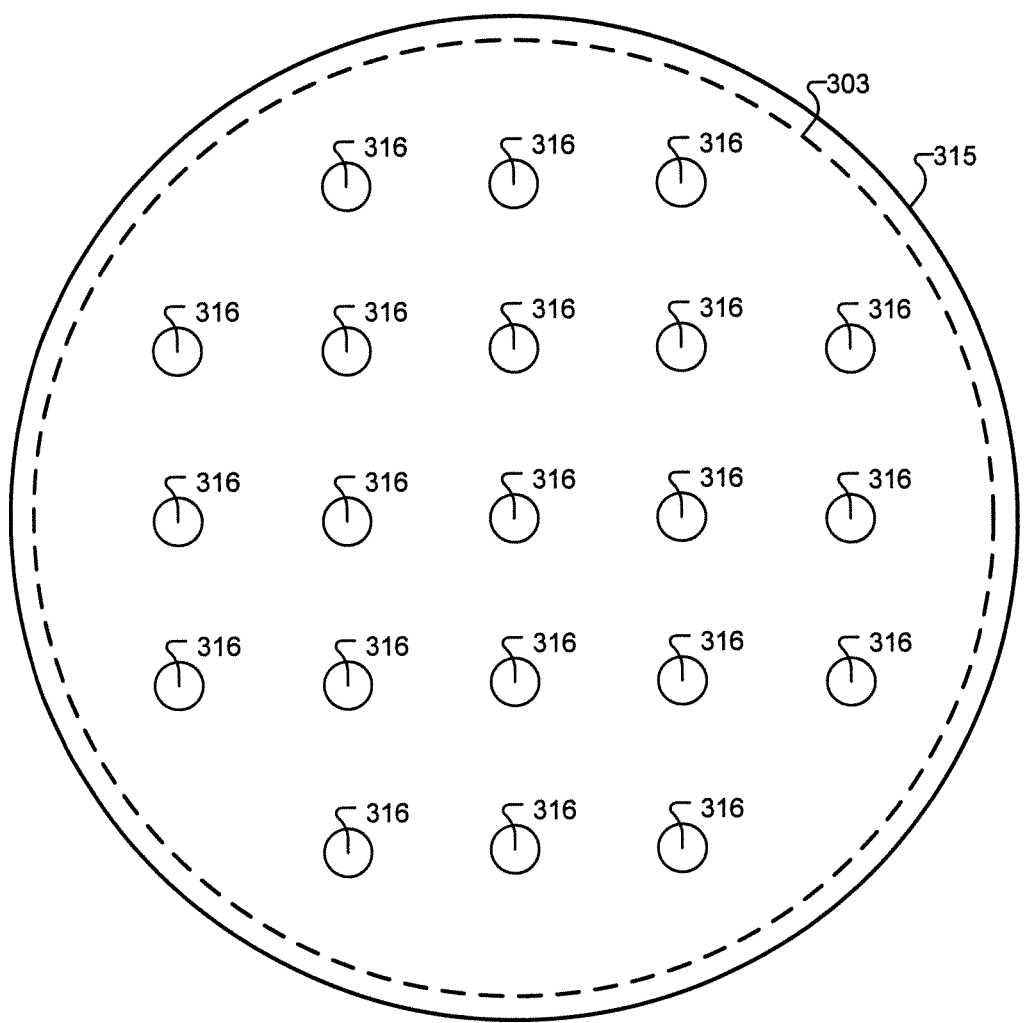
FIG. 3D shows a variation of the horizontal cross-section view of FIG. 3B in which the spacing between the fluid transmission pathways across the top plate is increased, in accordance with one embodiment of the present invention.
Figure 3E:
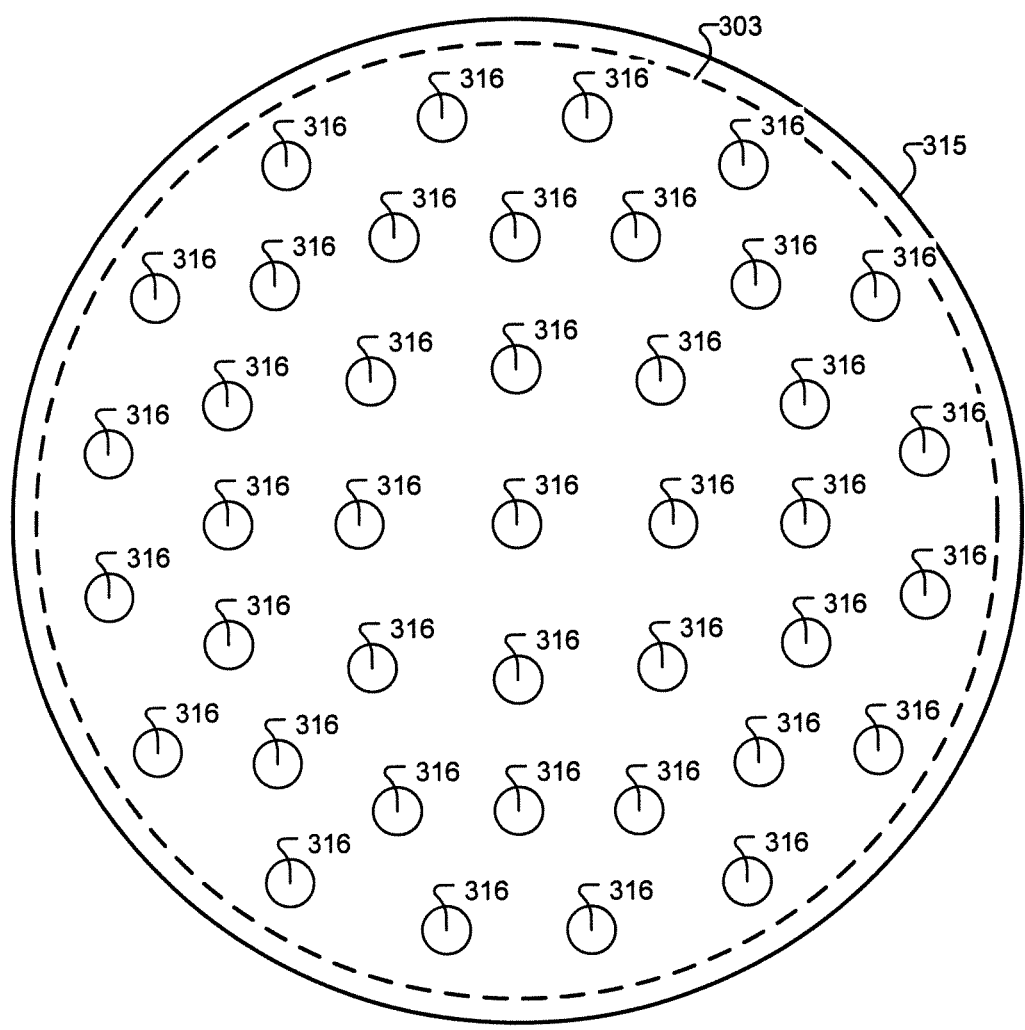
FIG. 3E shows a variation of the horizontal cross-section view of FIG. 3B in which the spacing between the fluid transmission pathways across the top plate is non-uniform, in accordance with one embodiment of the present invention.

It should be appreciated that the spacing between the fluid transmission pathways 316 across the top plate 315 can be varied among different embodiments. FIG. 3C shows a variation of the horizontal cross-section view of FIG. 3B in which the spacing between the fluid transmission pathways 316 across the top plate 315 is decreased, in accordance with one embodiment of the present invention. FIG. 3D shows a variation of the horizontal cross-section view of FIG. 3B in which the spacing between the fluid transmission pathways 316 across the top plate 315 is increased, in accordance with one embodiment of the present invention. FIG. 3E shows a variation of the horizontal cross-section view of FIG. 3B in which the spacing between the fluid transmission pathways 316 across the top plate 315 is non-uniform, in accordance with one embodiment of the present invention.

In one example embodiment, a total number of the fluid transmission pathways 316 through the top plate 315 is within a range extending from about 50 to about 200. In one example embodiment, a total number of the fluid transmission pathways 316 through the top plate 315 is about 100. It should be understood, however, that the above-mentioned example embodiments for the number and configuration of the fluid transmission pathways 316 through the top plate 315 are provided by way of example to facilitate description of the present invention. In other embodiments, essentially any number and configuration of fluid transmission pathways 316 can be defined and arranged through the top plate 315 as necessary to provide an appropriate mixture and distribution of reactive constituents 325, i.e., radicals and/or ions, within the substrate processing region 302, so as to achieve a desired plasma processing result on the substrate 109.

The plasma-driven substrate processing system 300 of FIG. 3A further includes at least one electron beam source 363 defined to generate an electron beam 367 and transmit the electron beam 367 through the substrate processing region 302 above and across the substrate support 303. Each electron beam source 363 is electrically connected to receive power from a power supply 389, such that power can be supplied to each electron beam source 363 in an independently controlled manner. Depending on the type of electron beam source 363, the power supply 389 can be defined to transmit DC power, RF power, or a combination thereof, to the electron beam sources 363.

In one embodiment, each electron beam source 363 is defined to transmit the electron beam 367 along a trajectory substantially parallel to a surface of the substrate support 303 defined to support the substrate 109. Also, each electron beam source 363 can be defined to generate and transmit one or multiple electron beams 367. During operation, the electron beam source 363 is operated to transmit the electron beam 367 through the substrate processing region 302 as an ion generating gas, such as argon, is flowed through the substrate processing region 302. In one embodiment, the ion generating gas is a component of a process gas mixture supplied from the process gas source 319, and flows into the substrate processing region 302 through the fluid transmission pathways 316 in the top plate 315.

Electron beam 367 injection into the substrate processing region 302, such as that provided by the electron beam source 363, causes an increase in charged particle production, i.e., ion production, within the substrate processing region 302 in the vicinity of the electron beam 367. The electron beam 367 injection into the substrate processing region 302 is optimized to create substantially more ions through electron impact ionization events as compared to radicals through electron impact dissociation of the process gas. In one embodiment, a method to establish this preference for ionization relative to dissociation may include one or more of optimization of a position of the electron beam 367 source, optimization of a number of electrons injected into the processing region 302, and/or optimization of an energy of the electron beam 367. Therefore, it should be appreciated that electron beam 367 injection into and through the substrate processing region 302 provides for spatial and temporal control of an increase in ion density without substantially affecting radical density, thereby providing for an effective decoupling of ion density control from radical density control within the substrate processing region 302.

The embodiment of FIG. 3A also includes a number of conductive grids 365 positioned outside a perimeter of the substrate support 303 and above the substrate support 303. The conductive grids 365 are electrically connected to a power supply 387, so as to have a controlled voltage level applied to each of the conductive grids 365 in an independently controlled manner. Depending on the particular embodiment, the power supply 387 can be defined to transmit DC power, RF power, or a combination thereof, to the conductive grids 365.

In one embodiment, the conductive grids 365 are positioned at and over the electron beam outlet of each electron beam source 363. In this embodiment, the power to the conductive grid 365 can be controlled to enhance, or at least not inhibit, electron beam 367 transmission from the electron beam source 363 over which the conductive grid 365 is positioned. And, a positive charge can be applied to a given conductive grid 365 that is positioned on a far side of the substrate support 303 away from an active electron beam source 363, such that the given positively charged conductive grid 365 functions as an electrical sink for the electron beam 367 transmitted by the active electron beam source 363.

Figure 3F:
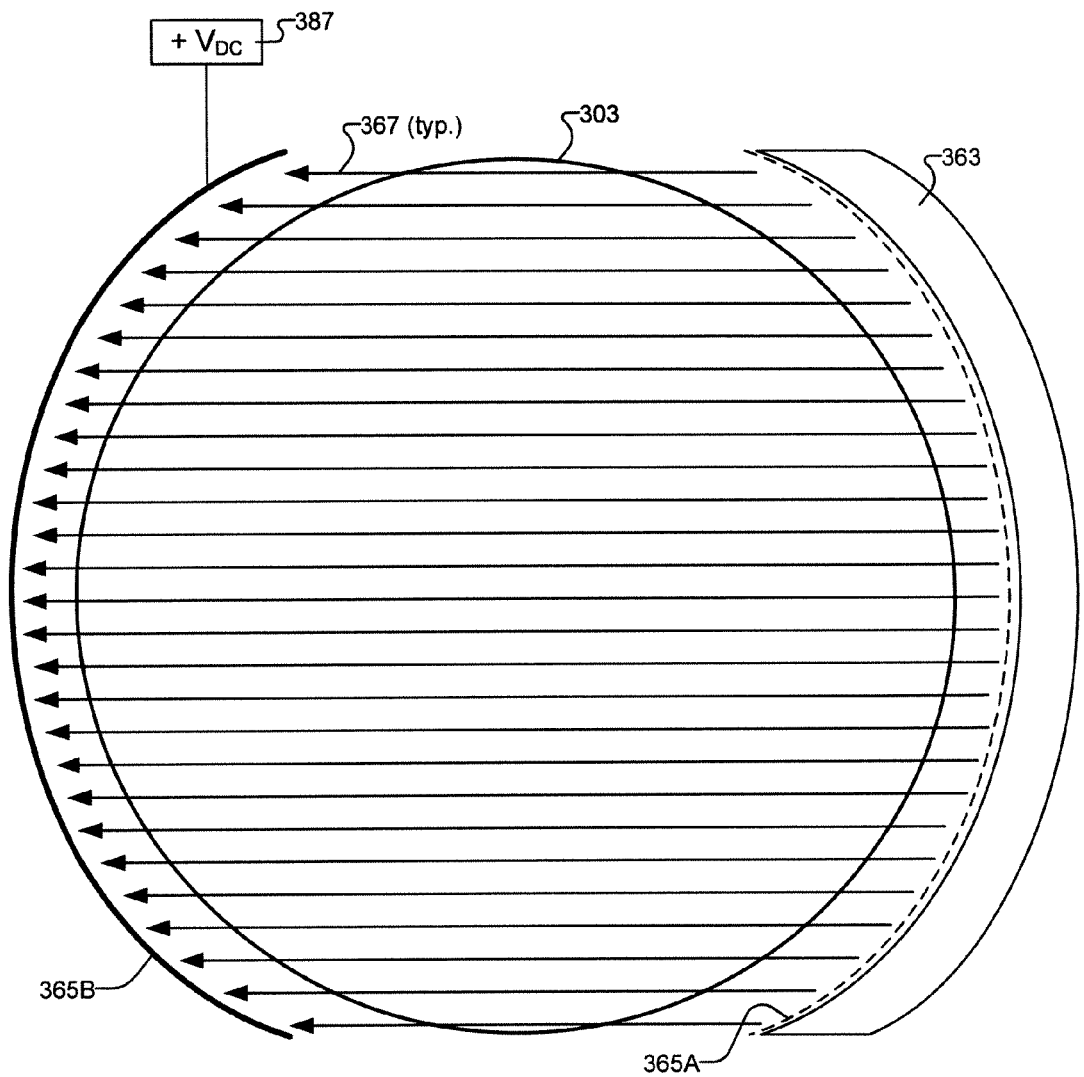
FIG. 3F shows a top view of the substrate support in a system configuration in which an electron beam source is defined to transmit multiple spatially separated electron beams through the substrate processing region, above and across the substrate support, in a common direction, in accordance with one embodiment of the present invention.

As previously mentioned, the system 300 can include one or more electron beam sources 363. FIG. 3F shows a top view of the substrate support 303 in a system 300 configuration in which an electron beam source 363 is defined to transmit multiple spatially separated electron beams 367 through the substrate processing region 302, above and across the substrate support 303, in a common direction, in accordance with one embodiment of the present invention. The electron beam source 363 can be defined and operated to transmit the electron beams 367 in either a continuous or pulsed manner. Also, the electron beam source 363 can be defined and operated to transmit the electron beams 367 in a spatially segmented manner, such that the electron beams 367 are transmitted in the single common direction over a portion of the substrate support 303 at a given time. In this case, the electron beam source 363 can be defined and operated to transmit the spatially segmented electron beams 367 in a temporally multiplexed manner, such that the electron beams 367 are collectively transmitted across an entirety of the substrate support 303 (and substrate 109 disposed thereon) in a time-averaged substantially uniform manner. In this manner, the electron beams 367 collectively provide a substantially uniform ion generation effect across the substrate support 303 and substrate 109 disposed thereon.

In the embodiment of FIG. 3F, a first conductive grid 365A is disposed over the electron beam outlet of the electron beam source 363. This first conductive grid 365A can be powered to facilitate/enhance transmission of the electron beam 367 from the electron beam source 363. Also, in this embodiment, a second conductive grid 365B is disposed at a position opposite the substrate support 303 from the electron beam source 363. The second conductive grid 365B is electrically connected to the power supply 387 so as to receive a positive electrical charge. In this manner, the second conductive grid 365B functions as an electrical sink for the electron beams 367 transmitted in the single common direction across the substrate processing region 302 from the electron beam source 363.

Figure 3G:
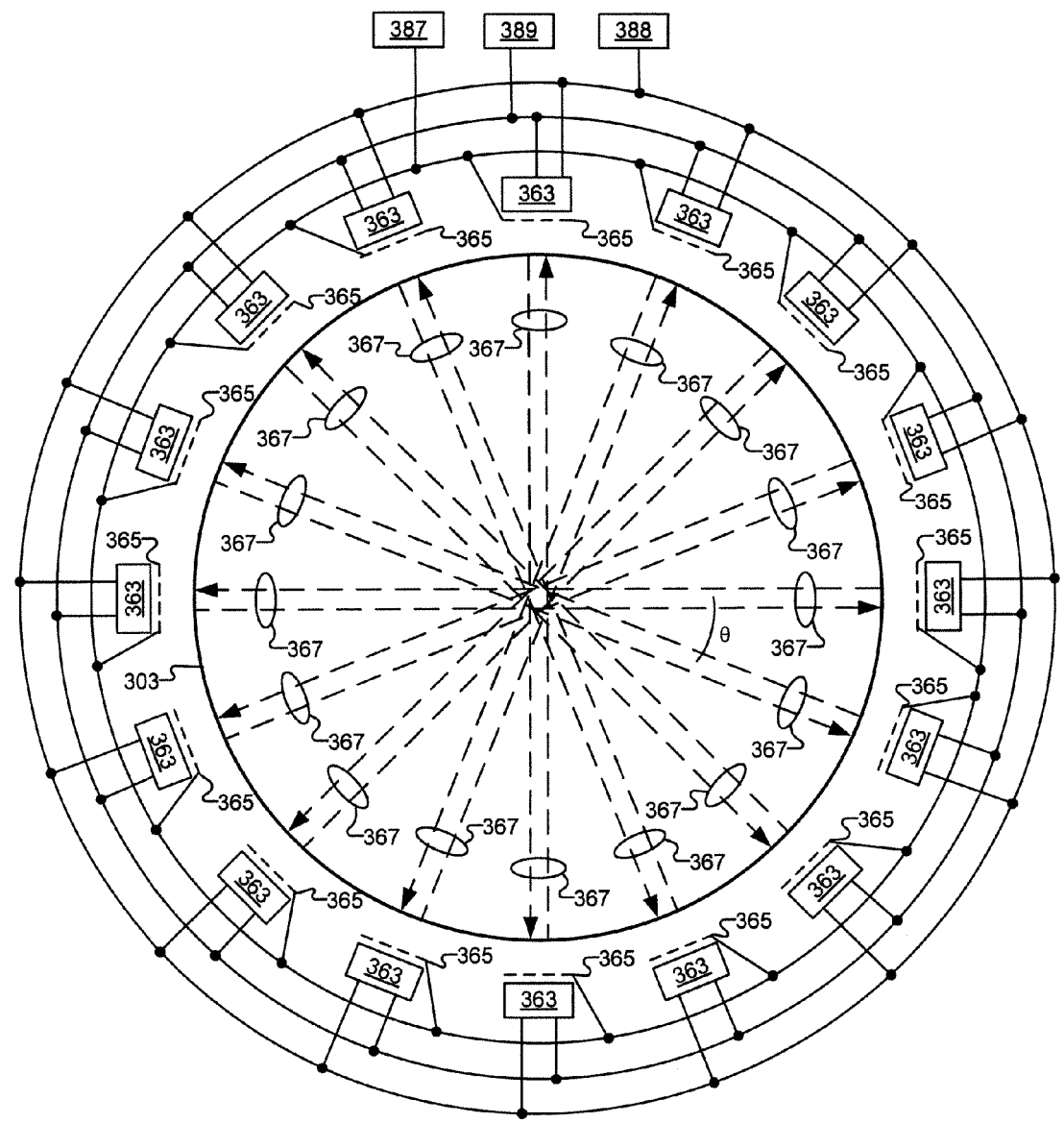
FIG. 3G shows a top view of the substrate support in the system configuration in which multiple electron beam sources are defined to transmit multiple spatially separated electron beams through the substrate processing region, above and across the substrate support, in respective multiple directions, in accordance with one embodiment of the present invention.

FIG. 3G shows a top view of the substrate support 303 in the system 300 configuration in which multiple electron beam sources 363 are defined to transmit multiple spatially separated electron beams 367 through the substrate processing region 302, above and across the substrate support 303, in respective multiple directions, in accordance with one embodiment of the present invention. Each electron beam source 363 can be defined and operated to transmit its electron beams 367 in either a continuous or pulsed manner. Also, the electron beam sources 363 can be defined and operated to transmit the electron beams 367 in a spatially rastered manner, such that the electron beams 367 are transmitted from a select number of electron beam sources 363 at a given time. In this case, one or more of the electron beam sources 363 can be operated at a given time. Also, in this embodiment, the electron beam sources 363 can be defined and operated to transmit the spatially rastered electron beams 367 in a temporally multiplexed manner, such that the electron beams 367 are collectively transmitted across an entirety of the substrate support 303 (and substrate 109 disposed thereon) in a time-averaged substantially uniform manner. In one embodiment, each of the electron beam sources 363 is defined and operated to transmit its electron beam 367 over a central location of the substrate support 303.

Additionally, in the embodiment of FIG. 3G, each of the conductive grids 365 is electrically connected to the power supply 387, such that each of the conductive grids 365 can be electrically charged (either positive or negative) in an independently controlled manner. In one embodiment, a conductive grid 365 that is disposed over the electron beam outlet of an active electron beam source 363 is electrically charged to either enhance transmission of the electron beam 367 or not inhibit transmission of the electron beam 367. And, another conductive grid 365 positioned opposite the substrate support 303 from the active electron beam source 363 is supplied with a positive electrical charge, such that this conductive grid 365 functions as an electrical sink for the electron beam 367 transmitted across the substrate processing region 302 from the active electron beam source 363.

FIG. 3H shows a rasterized temporal sequence for operation of the multiple electron beam sources 363 of FIG. 3G, in accordance with one embodiment of the present invention. As shown in FIG. 3H, the electron beam sources 363 are defined to sequentially transmit the multiple spatially separated electron beams 367. For example, at a time (Time 1), a first electron beam source 363 is operated to transmit its electron beams 367 across the substrate support 303. At a next time (Time 2) a second electron beam source 363 adjacent to the first electron beam source is operated to transmit its electron beams 367 across the substrate support 303. The remaining ones of the multiple electron beam sources 363 are operated in a sequential manner at successive times to transmit their electron beams 367 across the substrate support 303. Ultimately, a final electron beam source 363 is operated at a final time (Time 16) to transmit its electron beams 367 across the substrate support 303. Then, the rasterized temporal sequence of electron beam source 363 operation can be repeated, as necessary. It should be understood that in other embodiments, the electron beam sources 363 can be activated in essentially any order, e.g., a non-sequential order, and for essentially any time period so as to achieve a desired effect on the ion density within the substrate processing region 302.

It should be understood that the number of electron beam sources 363 shown in FIGS. 3G and 3H are provided by way of example. In one embodiment, 36 separate electron beam sources 363 are deployed around the periphery of the substrate support 303, and are spaced apart from each other such that adjacent ones of the 36 electron beam sources 363 transmit their respective electron beams across the substrate support 303 at an angular difference ($\theta$) of about 10 degrees relative to the center of the substrate support 303. In other embodiments, a different number of electron beam sources 363 can be deployed around the periphery of the substrate support 303 in a substantially uniform spaced apart manner. Regardless of the specific number of electron beam sources deployed around the periphery of the substrate support 303, it should be understood that the electron beam sources 363 can be deployed and operated to transmit their respective spatially rastered electron beams 367 in a temporally multiplexed manner, such that the electron beams 367 are collectively transmitted across an entirety of the substrate support 303 (and substrate 109 disposed thereon) in a time-averaged substantially uniform manner. In this manner, the electron beams 367 collectively provide a substantially uniform ion generation effect across the substrate support 303 and substrate 109 disposed thereon.

In various embodiments, the electron beam sources 363 can be defined as different types of electron beam sources. For example, in some embodiments, the electron beam source 363 are defined as one or more of hollow cathode devices, electron cyclotron resonance devices, laser-driven devices, microwave-driven devices, inductively coupled plasma generation devices, and capacitively coupled plasma generation devices. It should be understood that the above-mentioned types of electron beam sources 363 are provided by way of example. In other embodiments, essentially any type of electron beam sources 363 can be utilized in the system 300, so long as the electron beam sources 363 are defined to generate and transmit the required electron beams 367 through the substrate processing region 302, so as to achieve a desired effect on ion density within the substrate processing region 302 and corresponding plasma processing result on the substrate 109.

Figure 4A:
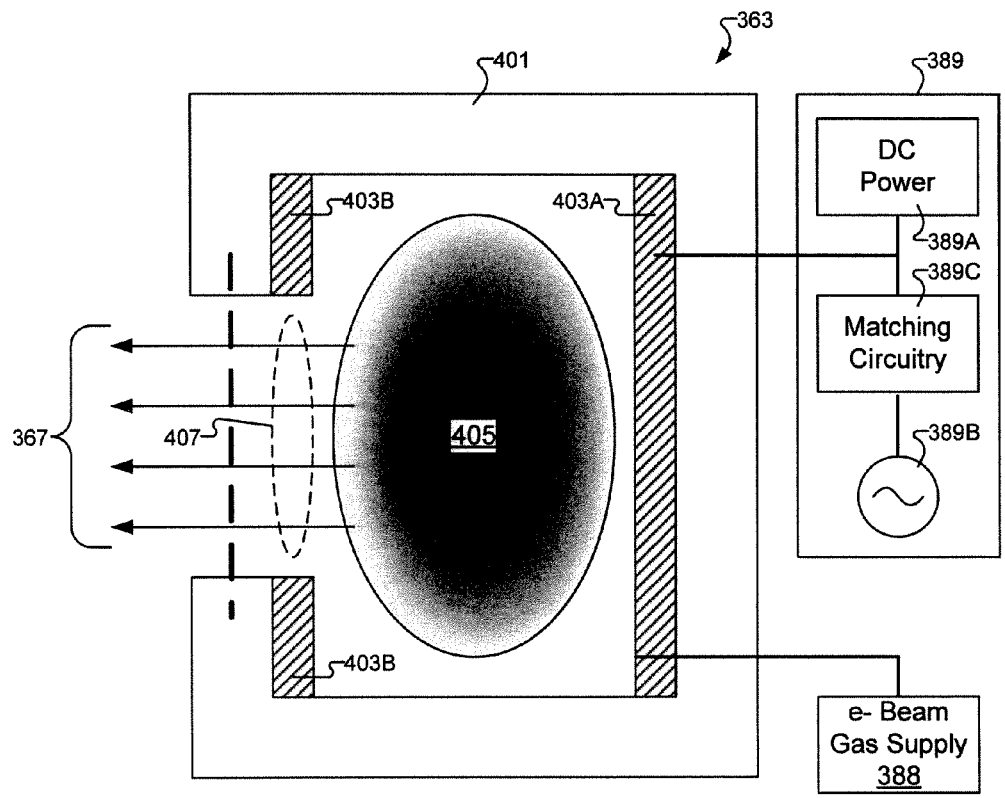
FIG. 4A shows an example electron beam source defined as a hollow cathode device, in accordance with one embodiment of the present invention.

FIG. 4A shows an example electron beam source 363 defined as a hollow cathode device 401, in accordance with one embodiment of the present invention. The hollow cathode device 401 is positioned outside a perimeter of the substrate support 303 and above the substrate support 303. The hollow cathode device 401 has an outlet region 407 oriented toward the substrate processing region 302 over the substrate support 303. The hollow cathode device 401 can be disposed within the system 300 so as to be electrically and RF isolated from surrounding chamber materials. In one embodiment, the hollow cathode device 401 includes a pair of electrodes 403A, 403B disposed on opposite sides of an interior cavity of the hollow cathode device 401. One or both of the electrodes 403A, 403B are electrically connected to receive power from the electron beam power source 389. The electron beam power source 389 can be defined to include a DC power supply 389A, an RF power supply 389B, or a combination thereof. The RF power supply 389B is connected to the electrodes 403A and/or 403B through matching circuitry 389C to provide impedance matching to minimize reflection of the transmitted RF power from the electrodes 403A and/or 403B.

In one embodiment, the electrodes 403A, 403B are positioned such that one electrode 403A is disposed opposite the hollow cathode device 401 interior from the electron beam 367 outlet of the hollow cathode device 401, and the other electrode 403B is disposed next to the outlet of the hollow cathode device 401. However, it should be understood that in other embodiments, the electrodes 403A, 403B can be disposed in other locations and/or orientations within the interior cavity of the hollow cathode device 401. Additionally, in other embodiments, the hollow cathode device 401 can be defined to implement power delivery components other than electrodes 403A, 403B, so long as the power delivery components are capable of conveying power to a process gas inside the interior of the hollow cathode device 401, so as to transform the process gas into a plasma 405. For example, in one embodiment, the walls of the hollow cathode device 401 are electrically conductive and serve the function of the power delivery components. In another example embodiment, the power delivery components are implemented as coils disposed proximate to the hollow cathode device 401.

The hollow cathode device 401 is also connected to the electron beam gas supply 388, such that the process gas for the electron beam generation can be flowed in a controlled manner from the electron beam gas supply 388 into the interior of the hollow cathode device 401. Upon entering the interior of the hollow cathode device 401, the process gas is transformed into the plasma 405 by the power emanating from the electrodes 403A, 403B, or other type of power delivery component. In one embodiment, RF power having a frequency of either 2 MHz, 27 MHz, 60 MHz, 400 kHz, or combination thereof is transmitted to the electrodes 403A, 403B, or other type of power delivery component, to transform the process gas into the plasma 405.

Additionally, in one embodiment, the hollow cathode device 401 is defined to implement an energized electron beam 367 outlet region 407 to enhance electron extraction from the interior cavity of the hollow cathode device 401. In one embodiment, the energizable outlet region 407 itself is defined as another hollow cathode. In one version of this embodiment, the outlet region 407 is circumscribed by an electrode that can be powered by either DC power, RF power, or a combination thereof. As the reactive constituents from the plasma 405 flow through the energizable outlet region 407, the power emanating from the electrode will liberate fast electrons within the outlet region 407, which will enhance the electron beam 367 transmitted from the hollow cathode device 401.

Figure 4B:
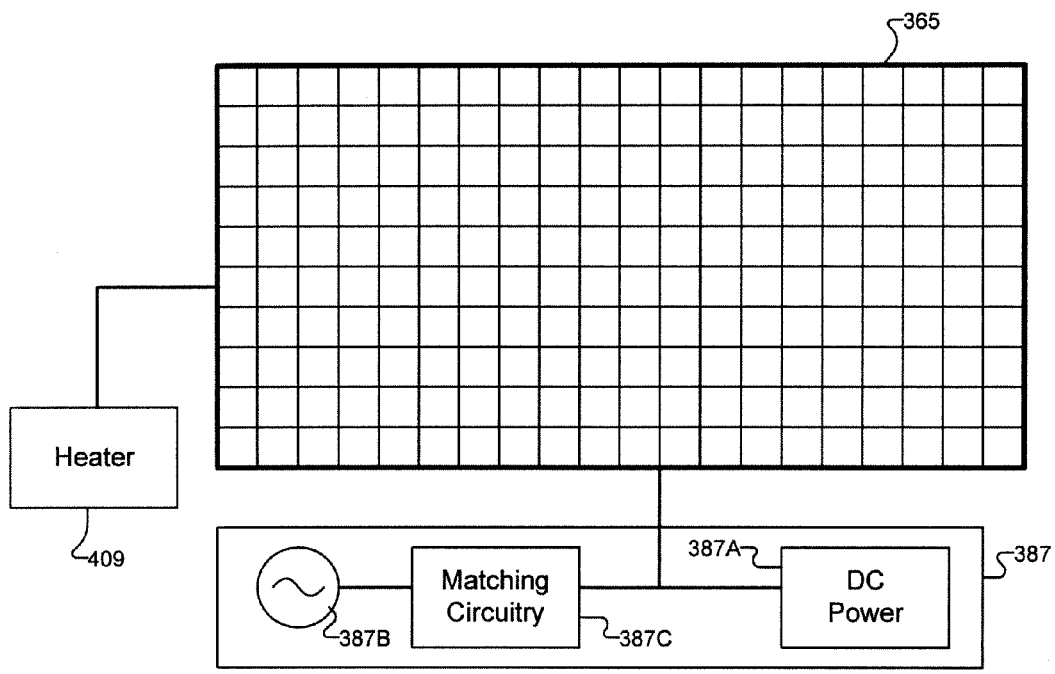
FIG. 4B shows a front view of the conductive grid, in accordance with one embodiment of the present invention.

In one embodiment, the conductive grid 365 is disposed over the electron beam 367 outlet region 407 of the hollow cathode device 401. More specifically, the conductive grid 365 is disposed between the outlet region 407 of the hollow cathode device 401 and the substrate processing region 302 over the substrate support 303 to facilitate extraction of electrons from the plasma 405 within the interior cavity of the hollow cathode device 401. FIG. 4B shows a front view of the conductive grid 365, in accordance with one embodiment of the present invention. In one embodiment, the conductive grid 365 is electrically connected to receive power from the conductive grid power supply 387. The power source 387 can be defined to include a DC power supply 387A, an RF power supply 387B, or a combination thereof. The RF power supply 387B is connected to the conductive grid 365 through matching circuitry 387C to provide impedance matching to minimize reflection of the transmitted RF power from the conductive grid 365.

Additionally, in one embodiment, the conductive grid 365 is connected to a heater 409 to provide for independent temperature control of the conductive grid 365, which can be used to maintain a cleanliness state of the conductive grid 365. In one embodiment, the conductive grid 365 operates as an extraction grid to extract electron flux from the plasma 405 within the interior cavity of the hollow cathode device 401. Additionally, in one embodiment, the conductive grid 365 can be operated in a pulsed manner such that a polarity of the electrical charge on the conductive grid 365 is alternated between positive and negative between pulses. In this embodiment, the conductive grid 365 operates to extract electron flux from the plasma 405 when supplied with a positive charge pulse, and extract ions from the plasma 405 when supplied with a negative charge pulse. Thus, in this embodiment, the conductive grid 365 can be pulsed in an alternating manner between an ion extraction mode and an electron extraction mode. Also, this pulsing of the conductive grid provides period averaged null current and access to ion driven ionization processes within the substrate processing region 302. Additionally, another conductive grid 365 disposed opposite the substrate support 303 from the outlet region 407 of the hollow cathode device 401 can be operated to have a positive charge to provide an electrical sink for the electron beam 367 transmitted by the hollow cathode device 401.

Figure 5A:
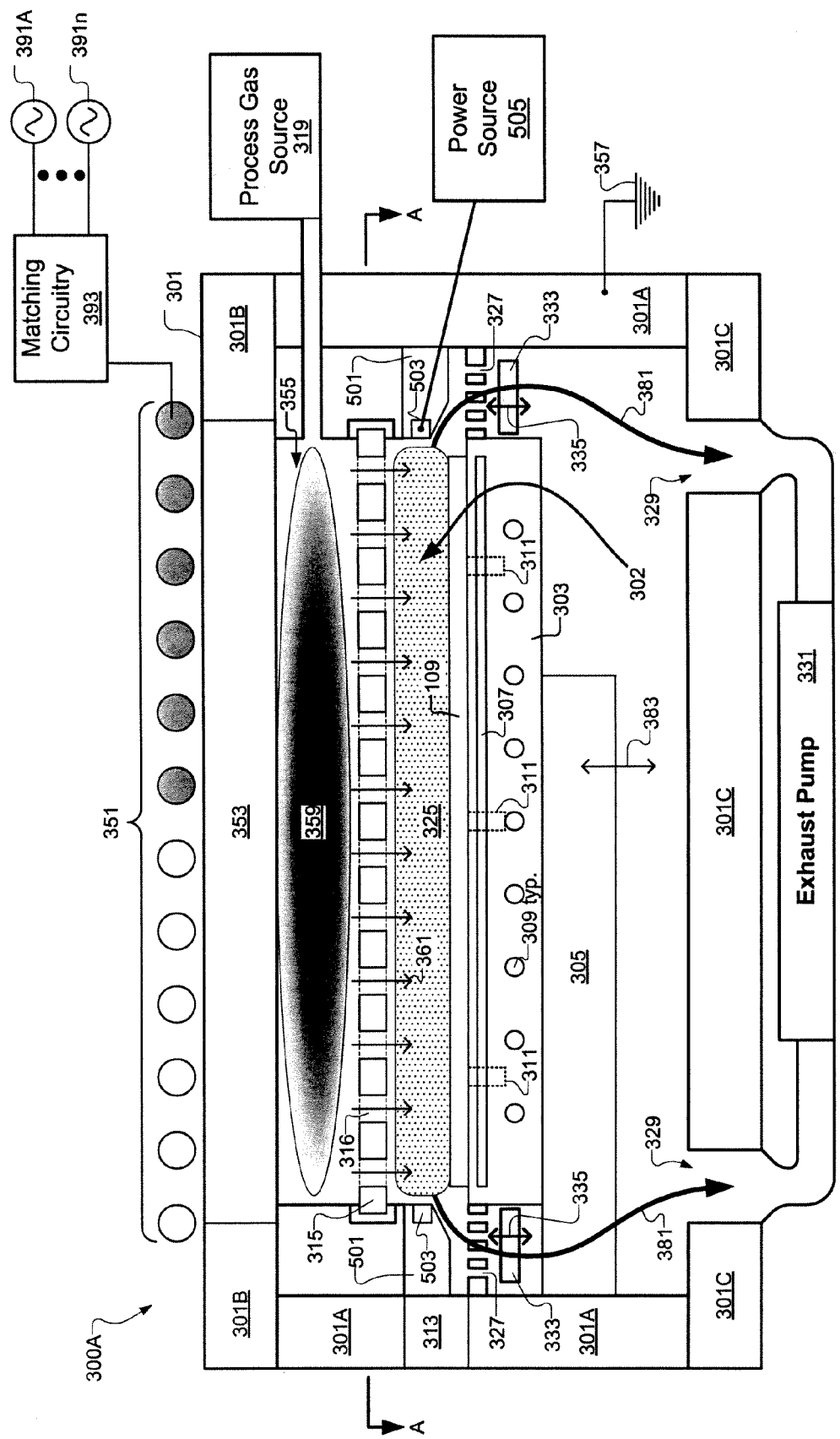
FIG. 5A shows a variation of the plasma-driven substrate processing system that implements a DC-biased surface electron beam source, in accordance with one embodiment of the present invention.

FIG. 5A shows a variation of the plasma-driven substrate processing system 300 that implements a DC-biased surface electron beam source 503, in accordance with one embodiment of the present invention. The system 300A of FIG. 5A includes the DC-biased electron beam source 503 in lieu of the electron beam sources 363 and conductive grids 365. For ease of description, the DC-biased electron beam source 503 is referred to hereafter as an electrode 503. The electrode 503 is disposed within an electrically insulating member 501, such that a surface of the electrode 503 is exposed to the substrate processing region 302. Also, the electrode 503 is disposed within the processing chamber 301 separate from the substrate support 303. In one embodiment, the electrode 503 is defined as a conductive band disposed outside a perimeter of the substrate support 303 and above the substrate support 303 within the substrate processing region 302 of the processing chamber 301. In one embodiment, the electrode 503 is defined as a band or strap that circumscribes the substrate processing region 302 around the substrate support 303.

In the system 300A, the electrode 503 is electrically connected to a power supply 505. In one embodiment, the power supply 505 is defined to apply electrical power to the electrode 503 so as to attract ions within the substrate processing region 302 toward the electrode 503 and liberate electrons from the electrode 503 into the substrate processing region 302. In different embodiments, the electrical power supplied to the electrode 503 from the power supply 505 can be DC power, RF power, or a combination of DC and RF power. In one embodiment, a negative voltage is applied to the electrode 503 by the power supply 505. However, in other embodiments, the voltage applied to the electrode 503 by the power supply 505 can be either negative or positive. For example, in one embodiment, the power supply 505 is defined to supply a positive voltage to the electrode 503, thereby attracting electrons and repelling positively charged ions. Also, in one embodiment, the power supply 505 is defined to apply power to the electrode 503 in a pulsed manner and/or in an alternating polarity manner.

Figure 5B:
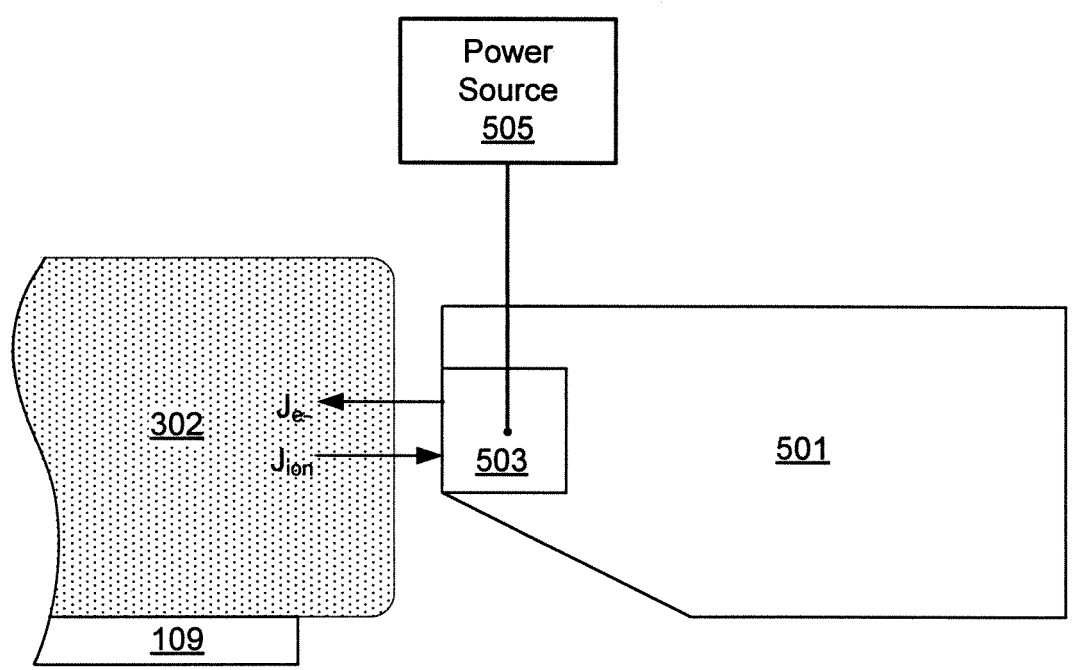
FIG. 5B shows a close-up view of the electrode, in accordance with one embodiment of the present invention.

FIG. 5B shows a close-up view of the electrode 503, in accordance with one embodiment of the present invention. In one embodiment, the electrode 503 provides a DC-biased surface from which an incident ion flux ($J_{ion}$) generates an electron flux ($J_{e^-}$), i.e., electron beam, that leaves the surface of the electrode 503 in a direction toward the substrate processing region 302. In one embodiment, the ions in the ion flux ($J_{ion}$) that are incident upon the electrode 503 are non-inert and are passivating, such as Si ions. In this embodiment, the DC-biased surface of the electrode 503 can be utilized to compensate for the passivating species that are produced through radical interactions. In one embodiment, the electrode 503 can be powered with either DC power, RF power, or a combination thereof. Also, in one embodiment, a low frequency RF power is supplied to the electrode 503.

Additionally, in one embodiment, the electrode 503 is sized to create a hollow cathode effect within the substrate processing region 302. More specifically, if the DC-biased surface of the electrode 503 is defined as a large enough band or strap that circumscribes the substrate processing region 302, such that electrons emitted from the electrode 503 reach the opposing portion of the electrode 503 with sufficient energy, a hollow cathode configuration may be formed within the substrate processing region 302 itself, thereby further enhancing the ionization within the substrate processing region 302.

Figure 6A:
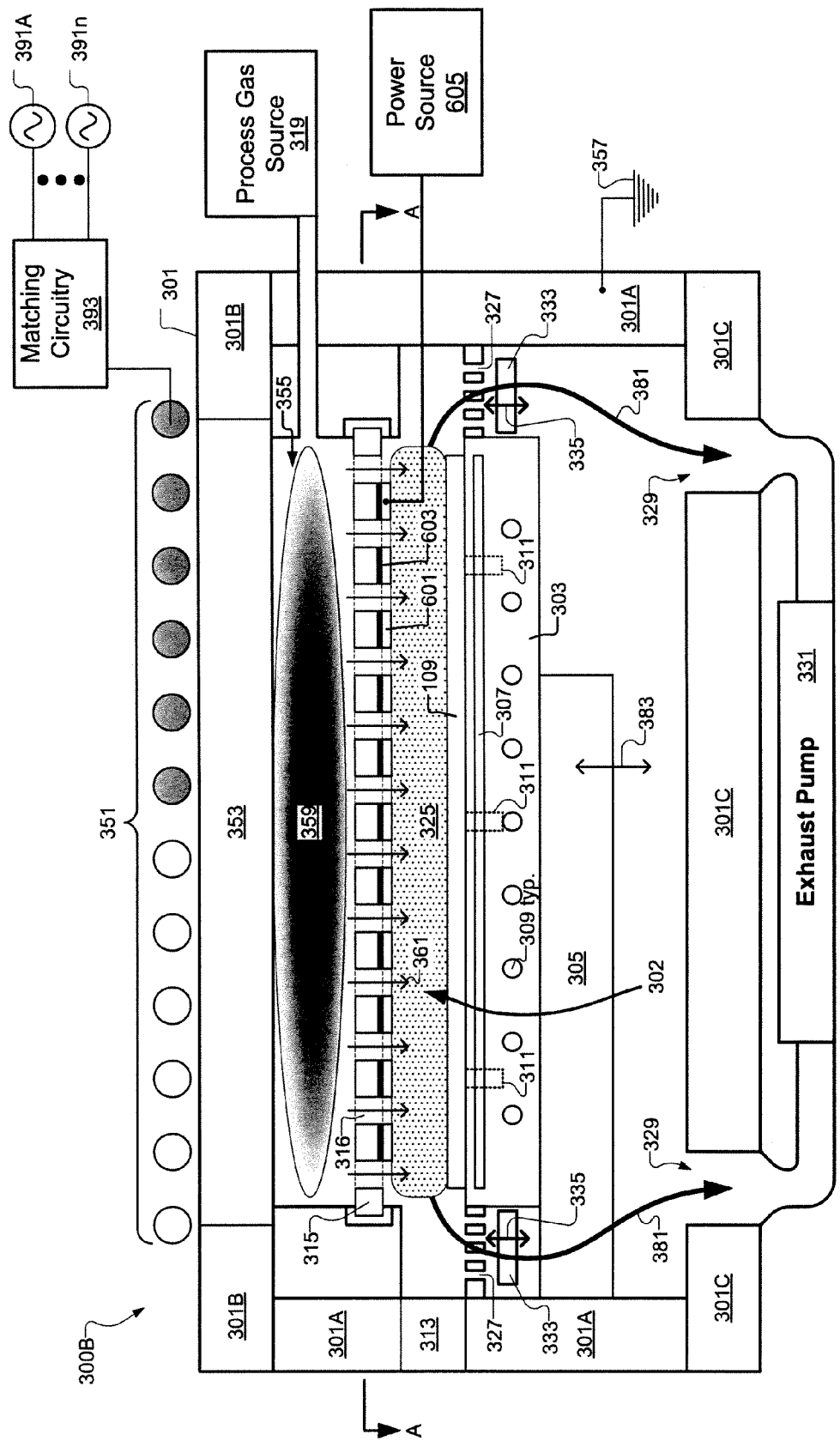
FIG. 6A shows a variation of the plasma-driven substrate processing system that implements a planar DC-biased surface electron beam source, in accordance with one embodiment of the present invention.

FIG. 6A shows a variation of the plasma-driven substrate processing system 300 that implements a planar DC-biased surface electron beam source 601, in accordance with one embodiment of the present invention. Relative to the system 300 of FIG. 3A, the system 300B of FIG. 6A includes the planar DC-biased electron beam source 601 in lieu of the electron beam sources 363 and conductive grids 365. For ease of description, the DC-biased electron beam source 601 is referred to hereafter as a planar electrode 601. In one embodiment, the planar electrode 601 is defined as a planar conductive segment 601 disposed above the substrate support 303 within the substrate processing region 302. In one embodiment, the planar electrode 601 is implemented within the system 300B in combination with the electrode 503 as discussed above with regard to FIGS. 5A-5B.

For example, in one embodiment, the planar electrode 601 is defined on a bottom surface of the top plate 315 in an orientation facing the substrate support 303, so as to face the substrate processing region 302. In one embodiment, the planar electrode 601 is electrically insulated from the top plate 315 by an insulating member 603. Also, in this embodiment, it should be understood that each of the planar electrode 601 and the insulating member 603 includes a number of through-holes formed in alignment with the number of fluid transmission pathways 316 present in the top plate 315, such that both planar electrode 601 and insulating member 603 avoid interfering with a flow of reactive constituents from the plasma generation chamber 355 into the substrate processing region 302.

In the system 300B, the planar electrode 601 is electrically connected to a power supply 605. In one embodiment, the power supply 605 is defined to apply a negative voltage to the planar electrode 601 so as to attract ions within the substrate processing region 302 toward the planar electrode 601 and liberate electrons from the planar electrode 601 into the substrate processing region 302. In one embodiment, the power supply 605 is defined to apply power to the planar electrode 601 in a pulsed manner. Also, in one embodiment, the power supply 605 is defined to supply a positive voltage to the planar electrode 601, thereby attracting electrons and repelling positively charged ions.

Figure 6B:
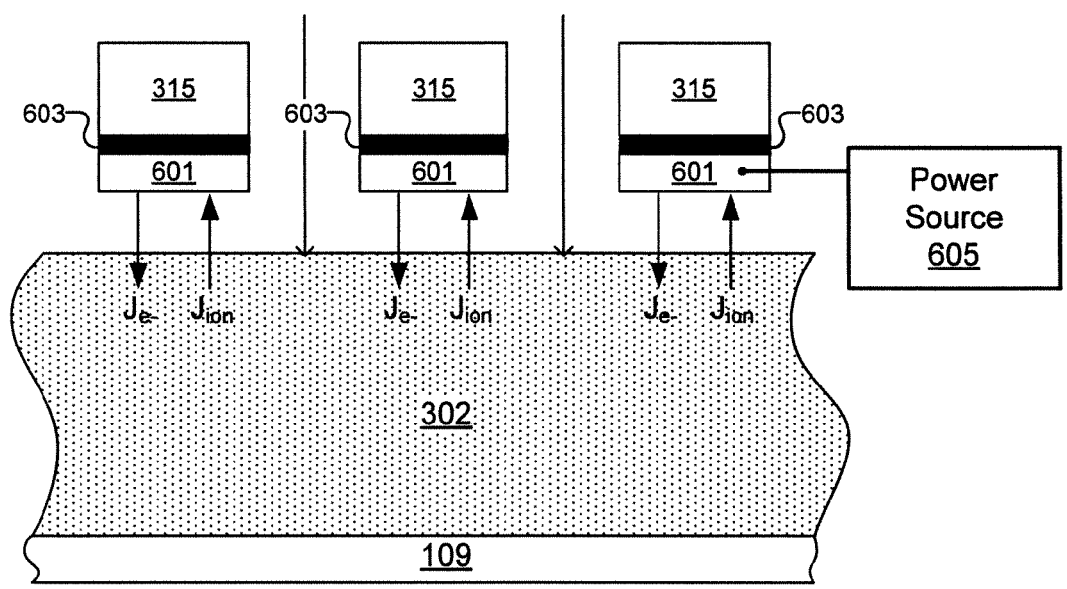
FIG. 6B shows a close-up view of the planar electrode, in accordance with one embodiment of the present invention.

FIG. 6B shows a close-up view of the planar electrode 601, in accordance with one embodiment of the present invention. In one embodiment, the planar electrode 601 provides a DC-biased surface from which an incident ion flux ($J_{ion}$) generates an electron flux ($J_{e^-}$), i.e., electron beam, that leaves the surface of the planar electrode 601 in a direction toward the substrate processing region 302. In one embodiment, the ions in the ion flux ($J_{ion}$) that are incident upon the planar electrode 601 are non-inert and are passivating, such as Si ions. In this embodiment, the DC-biased surface of the planar electrode 601 can be utilized to compensate for the passivating species that are produced through radical interactions. In one embodiment, the planar electrode 601 can be powered with either DC power, RF power, or a combination thereof. Also, in one embodiment, a low frequency RF power is supplied to the electrode 601.

As previously discussed, a total flow area of the fluid transmission pathways 316 between the plasma generation chamber 355 and the substrate processing region 302 can be quite small. For example, the fluid transmission pathways 316 can include small tube diameters or a small numbers of holes of small diameter in order to maintain an adequate pressure differential between the higher pressure plasma generation chamber 355 and the lower pressure substrate processing region 302. Therefore, because large gas densities, i.e., high gas pressures, may be needed in the plasma generation chamber 355 to achieve a sufficient amount of electron production, it may not be feasible to simply increase the flow area of the fluid transmission pathways 316 to obtain a higher ion flux from the plasma generation chamber 355 into the substrate processing region 302.

Figure 7:
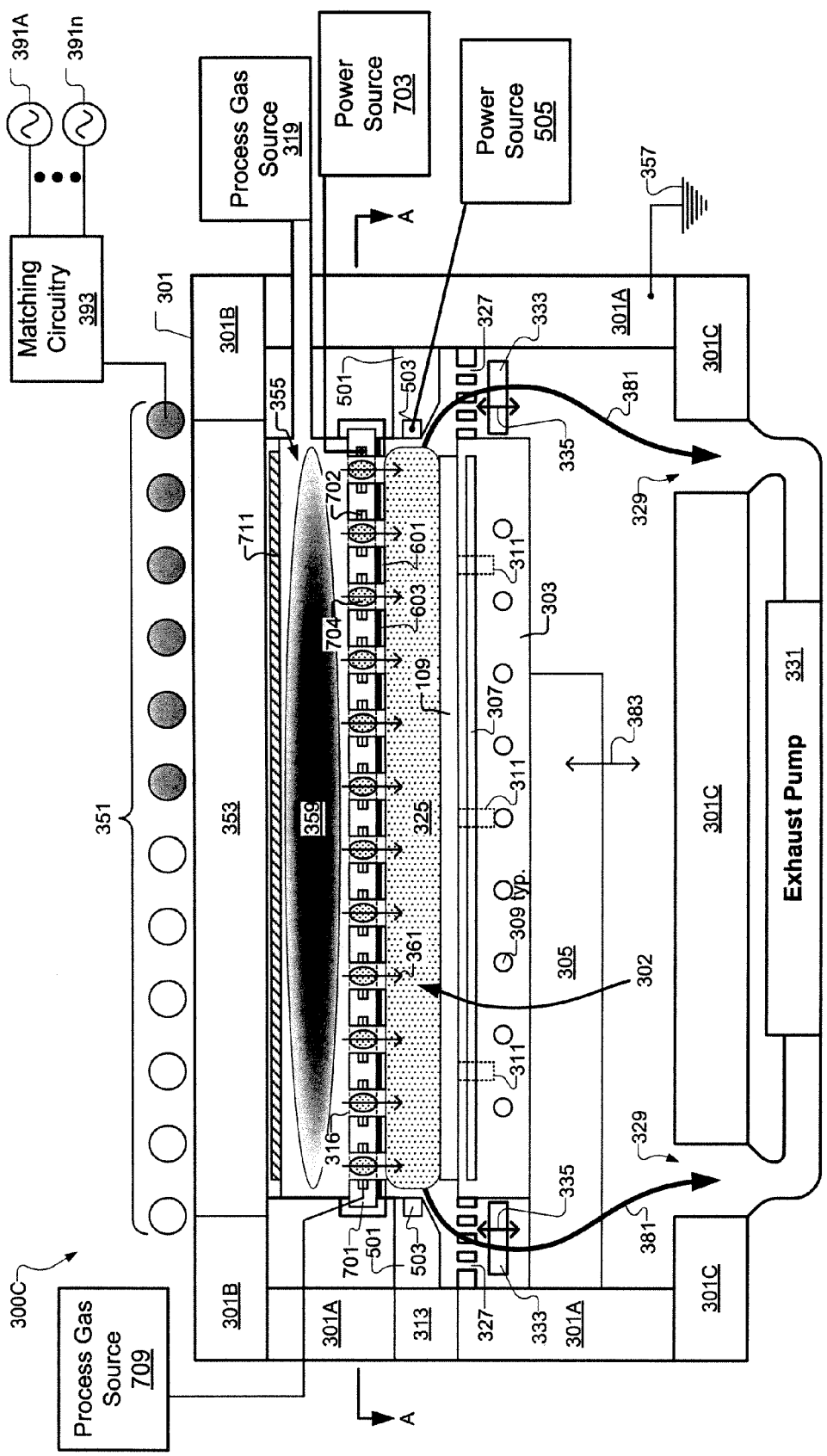
FIG. 7 shows a variation of the plasma-driven substrate processing system that utilizes the fluid transmission pathways as supplementary ion generation regions, in accordance with one embodiment of the present invention.

To overcome the geometric limits to ion transfer efficiency associated with the fluid transmission pathways 316, one embodiment of the present invention utilizes the fluid transmission pathways 316 as supplementary ion generation regions, i.e., as plasma boosters. FIG. 7 shows a variation of the plasma-driven substrate processing system 300 that utilizes the fluid transmission pathways 316 as supplementary ion generation regions, in accordance with one embodiment of the present invention. In the embodiment of FIG. 7, the top plate 315 in the system 300 of FIG. 3A is replaced by an energizable top plate 701. As with the top plate 315, the energizable top plate 701 includes the number of fluid transmission pathways 316 formed through the energizable top plate 701 so as to extend from the plasma generation chamber 355 to the substrate processing region 302. However, the energizable top plate 701 includes a number of power delivery components 702 disposed proximate to each of the number of fluid transmission pathways 316. The power delivery components 702 are defined to deliver power to the fluid transmission pathways 316 so as to generate supplemental plasma 704 within the fluid transmission pathways 316. The fluid transmission pathways 316 are defined to supply reactive constituents of both the plasma 359 and the supplemental plasma 704 to the substrate processing region 302.

The system 300C also includes a power source 703 defined to supply DC power, RF power, or a combination thereof, to the power delivery components 702. The power delivery components 702 in turn function to transmit power through the fluid transmission pathways 316 so as to transform process gas within the fluid transmission pathways 316 into the supplemental plasma 704. In one embodiment, the system 300C can also include a process gas source 709 in fluid communication with each of the fluid transmission pathways 316 to provide for supply of a secondary process gas to each of the fluid transmission pathways 316. The power transmitted from the power delivery components 702 can be used to transform the secondary process gas into the supplemental plasma 704. However, in another embodiment, the system 300C may not utilize the secondary process gas source 709. In this embodiment, the power delivery components 702 are defined to transform process gas that flows through the fluid transmission pathways 316 from the plasma generation chamber 355 into the supplemental plasma 704. In this embodiment, the fluid transmission pathways 316 are operated as plasma amplifying region.

It should be understood that in the system 300C the fluid transmission pathways 316, power delivery components 702, and power source 703 can be defined in many ways to form different types of supplemental plasma 704 generation regions within the fluid transmission pathways 316. For example, in various embodiments, the fluid transmission pathways 316, power delivery components 702, and power source 703 can be defined such that the fluid transmission pathways 316 operate as flow-through hollow cathodes, flow-through capacitively coupled regions, flow-through inductively coupled regions, flow-through magnetron driven regions, flow-through laser driven regions, or a combination thereof. In other words, in various embodiments, each fluid transmission pathway 316 can be operated as either a hollow cathode, a capacitively coupled source, an inductive source (with inductive coils wrapping the fluid transmission pathway), through a magnetron effect, or through another kind of ionizing means, such as through irradiation of points in the fluid transmission pathway with focused laser light. In one embodiment, the fluid transmission pathways 316 are operated as a hollow cathode medium or with direct electron beam injection into the fluid transmission pathways 316 in order to achieve a sufficient amount of high energy electrons to produce significant amounts of ionization.

It should be understood that generation of the supplemental plasma 704 within the fluid transmission pathways 316 provides for an unimpeded line-of-sight transmission of ions from the supplemental plasma 704 into the substrate processing region 302, thereby providing for a controlled increase in ion flux entering the substrate processing region 302. Additionally, in one embodiment, the power delivery components 702 include electron beam sources defined to generate electron beams and transmit these electron beams through the fluid transmission pathways 316, so as to enhance ion generation within the supplemental plasma 704 formed within the fluid transmission pathways 316.

Additionally, in one embodiment, the system 300C can optionally include an electrode 711 disposed in the plasma generation chamber 355 to drive charged species from the plasma generation chamber 355 through the fluid transmission pathways 316 into the substrate processing region 302. Also, the electrode 711 can function to drive charged species from the supplemental plasma 704 within the fluid transmission pathways 316 into the substrate processing region 302. It should be understood that the electrode 711 can be connected to a power source to be supplied with DC power, RF power, or a combination thereof. Also, the polarity of the charge on the electrode 711 can be controlled and varied in a prescribed manner. For example, in one embodiment, power can be supplied to the electrode 711 in a pulsed manner.

Additionally, in one embodiment, the system 300C can optionally include the electrode 503 and corresponding power source 505, as previously discussed with regard to FIGS. 5A and 5B. Also, in one embodiment, the system 300C can optionally include the electrode beam sources 363, conductive grids 365, power sources 387 and 389, and electron beam gas supply 388, as previously discussed with regard to FIGS. 3A through 4B. And, in one embodiment, the system 300C can optionally include the planar electrode 601 and insulating member 603, as previously discussed with regard to FIGS. 6A and 6B. In this embodiment, the planar electrode 601 can be operated as an extraction grid disposed within the substrate processing region 302 to attract charged species from the fluid transmission pathways 316 into the substrate processing region 302. Depending on the polarity of the electric charge supplied to the planar electrode 601, the charged species attracted from the fluid transmission pathways 316 into the substrate processing region 302 can include either electrons or positively charged ions. As with the electrode 711, it should be understood that each of the electrode 503 and planar electrode 601 can be supplied with DC power, RF power, or a combination thereof. Also, as with the electrode 711, each of the electrode 503 and planar electrode 601 can be operated in an independently controlled manner, e.g., in a continuously powered manner or pulsed manner.

In one embodiment, the remote plasma 359 source within the plasma generation chamber 355 can be used as an electron beam source to affect ion-to-radical flux control in the substrate processing region 302. If the remote plasma 359 source within the plasma generation chamber 355 is operated with a substantially negative potential relative to the substrate processing region 302, then electrons can be accelerated from the negative potential of the plasma generation chamber 355 through the fluid transmission pathways 316 to the positive potential of the substrate processing region 302. As the energetic electrons travel through the fluid transmission pathways 316 and into the substrate processing region 302, the energetic electrons cause ionization in an energy regime in which simple dissociation processes are not favored. Also, if the energetic electrons scatter as they travel through the fluid transmission pathways 316, the energetic electrons can generate additional secondary electrons, especially given that the secondary electron generation coefficient can be very high and often higher than the ion generation coefficient associated with electron interaction processes.

It should be understood that different kinds of remote plasma 359 sources can be used for electron beam extraction from the plasma generation chamber 355 into the substrate processing region 302. For example, some embodiments can operate the plasma generation region 355 as a capacitively coupled plasma 359 source generation region, an inductively coupled plasma 359 source generation region, or a microwave plasma 359 source generation region in combination with DC biasing. Also, if the electrical potential difference between the plasma generation chamber 355 and substrate processing region 302 is inadequate for electron beam extraction from the plasma generation chamber 355 into the substrate processing region 302, an electron extraction grid can be used to extract electrons from the plasma generation chamber 355 into a secondary plasma source region, e.g., within the fluid transmission pathways 316, where the extracted electrons can produce more ions.

In view of the foregoing, it should be appreciated that spatial and/or temporal multiplexing of electron beam injection into the substrate processing region 302 facilitates modulation of the ion flux to radical flux within the substrate processing region 302. Also, it should be appreciated that use of electron beam excited plasma source in combination with a primarily radical constituent plasma source can provide a dynamic range of ion flux-to-radical flux ratio control that is not achievable by any other means.

Figure 8:
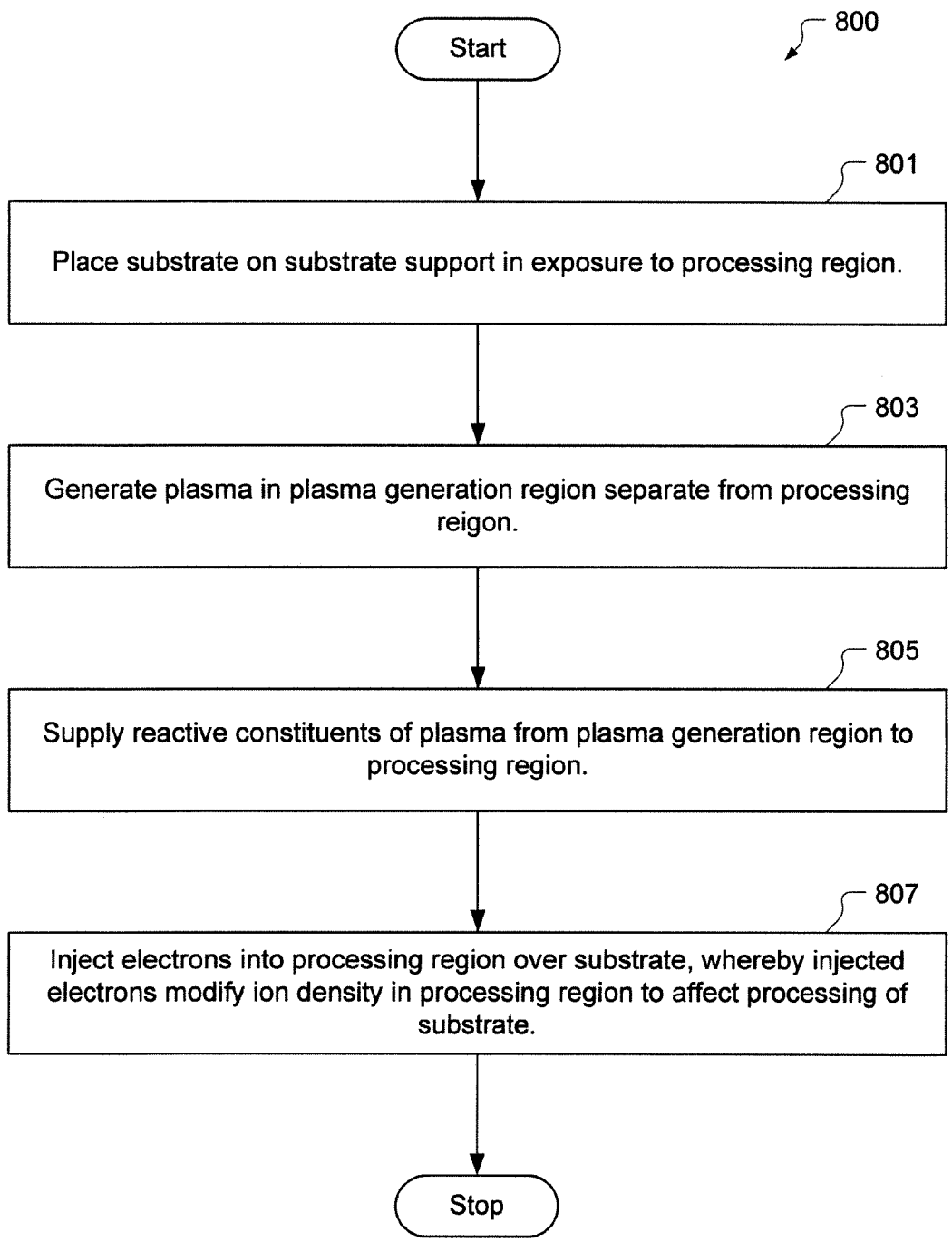
FIG. 8 shows a flowchart of a method for processing a semiconductor substrate, in accordance with one embodiment of the present invention.

FIG. 8 shows a flowchart of a method 800 for processing a semiconductor substrate, in accordance with one embodiment of the present invention. In one embodiment, the plasma-driven substrate processing system 300 of FIGS. 3A through 4B can be used to perform the method of FIG. 8. The method 800 includes an operation 801 for placing a substrate on a substrate support in exposure to a processing region. The method 800 also includes an operation 803 for generating a plasma in a plasma generation region separate from the processing region. The method 800 also includes an operation 805 for supplying reactive constituents of the plasma from the plasma generation region to the processing region. The method 800 further includes an operation 807 for injecting electrons into the processing region over the substrate, whereby the injected electrons modify an ion density in the processing region to affect processing of the substrate.

In one embodiment of the method 800, injecting electrons into the processing region includes transmitting an electron beam along a trajectory substantially parallel to a top surface of the substrate. In one instance of this embodiment, the trajectory of the electron beam extends in a linear manner from a first location outside a periphery of the substrate support and above the substrate support to a second location outside the periphery of the substrate support and above the substrate support. In another instance of this embodiment, the method 800 can include generating an electric steering field within the processing region, such that the trajectory of the electron beam extends through the processing region in a non-linear manner as controlled by the electric steering field. Also, in one embodiment, the method 800 includes an operation for applying a positive electrical charge to a conductive grid at the second location, i.e., at the electron beam terminating location, such that the conductive grid functions as an electrical sink for the electron beam transmitted along the trajectory. In various embodiments of the method 800, the electrons can be injected into the processing region in a pulsed manner, or in a continuous manner.

In one embodiment, the operation 807 for injecting electrons into the processing region includes transmitting multiple spatially separated electron beams through the processing chamber above and across a top surface of the substrate. In one instance of this embodiment, each of the multiple spatially separated electron beams is transmitted in a common direction, such that the multiple spatially separated electron beams are transmitted in a substantially parallel manner above and across the top surface of the substrate. In another instance of this embodiment, the multiple spatially separated electron beams are transmitted in different multiple directions above and across the top surface of the substrate and substantially parallel to the top surface of the substrate. Also, in one embodiment, different ones of the multiple spatially separated electron beams are transmitted at different times such that electrons are injected in a time-averaged substantially uniform manner throughout the processing region in exposure to the substrate. The method 800 can also include an operation for applying a bias voltage across the processing region from the substrate support so as to attract ions that are generated as a result of the injected electrons toward the substrate.

Figure 9:
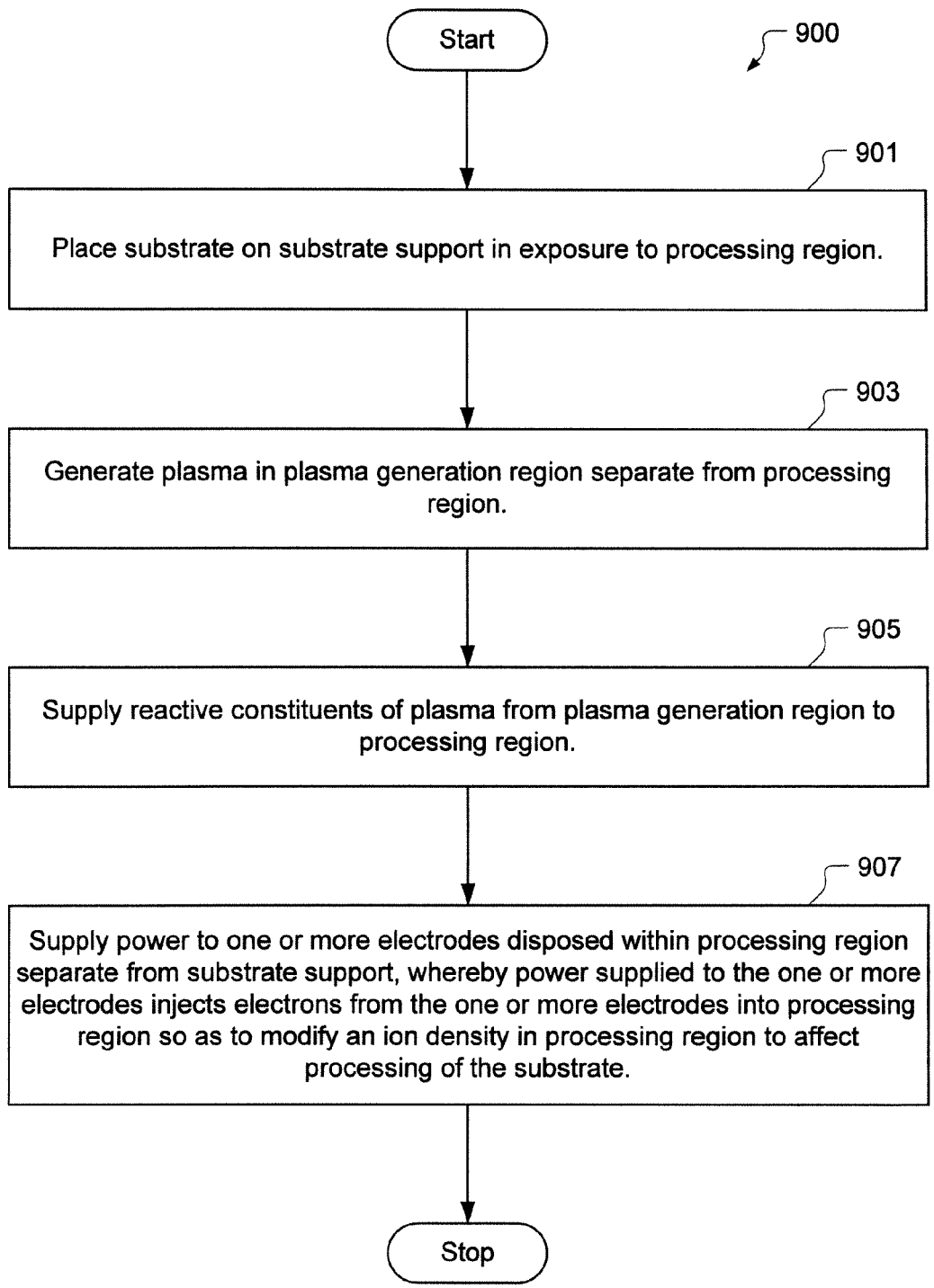
FIG. 9 shows a flowchart of a method for processing a semiconductor substrate, in accordance with one embodiment of the present invention.

FIG. 9 shows a flowchart of a method 900 for processing a semiconductor substrate, in accordance with one embodiment of the present invention. In one embodiment, the plasma-driven substrate processing systems 300A, 300B of FIGS. 5A through 6B, or combination thereof, can be used to perform the method of FIG. 9. The method 900 includes an operation 901 for placing a substrate on a substrate support in exposure to a processing region. The method 900 also includes an operation 903 for generating a plasma in a plasma generation region separate from the processing region. The method 900 also includes an operation 905 for supplying reactive constituents of the plasma from the plasma generation region to the processing region. The method 900 further includes an operation 907 for supplying power to one or more electrodes disposed within the processing region separate from the substrate support, whereby the power supplied to the one or more electrodes injects electrons from the one or more electrodes into the processing region so as to modify an ion density in the processing region to affect processing of the substrate.

In one embodiment, the one or more electrodes includes a conductive band disposed outside a perimeter of the substrate support and above the substrate support in exposure to the processing region, such as the electrode 503 of FIG. 5A. In one embodiment, the conductive band is formed as a continuous structure that circumscribes the perimeter of the substrate support. Also, in one embodiment, the one or more electrodes includes a planar conductive segment disposed above and over the substrate support in exposure to the processing region, such as the planar electrode 601 of FIG. 6A. Also, in one embodiment, the one or more electrodes includes both a conductive band disposed outside a perimeter of the substrate support and above the substrate support in exposure to the processing region, and a planar conductive segment disposed above and over the substrate support in exposure to the processing region.

In one embodiment, supplying power to one or more electrodes in the operation 907 includes supplying direct current power, radiofrequency power, or a combination of direct current power and radiofrequency power to the one or more electrodes. Also, in one embodiment, the power is supplied to one or more electrodes in a pulsed manner. In another embodiment, the power is supplied to one or more electrodes in a continuous manner. Also, in one embodiment, supplying power to one or more electrodes in the operation 907 includes alternating a polarity of electric charge on the one or more electrodes. Additionally, in one embodiment, the method can include an operation for applying a bias voltage across the processing region from the substrate support so as to attract ions that are generated as a result of the injected electrons toward the substrate.

Figure 10:
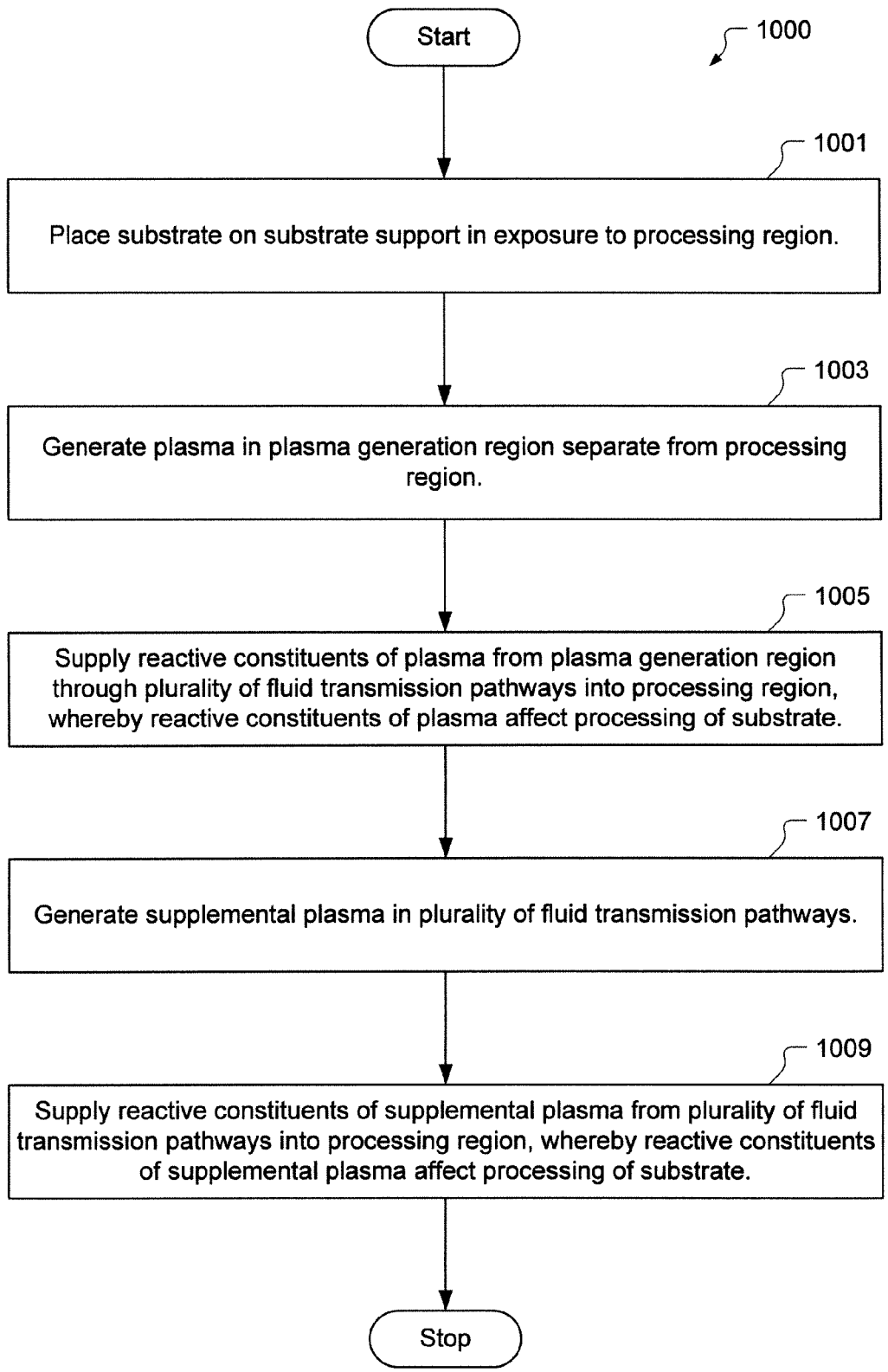
FIG. 10 shows a flowchart of a method for processing a semiconductor substrate, in accordance with one embodiment of the present invention.

FIG. 10 shows a flowchart of a method 1000 for processing a semiconductor substrate, in accordance with one embodiment of the present invention. In one embodiment, the plasma-driven substrate processing system 300C can be used to perform the method of FIG. 10. In one embodiment, the plasma-driven substrate processing system 300C can be combined with components of one or more of the plasma-driven substrate processing systems 300, 300A, and 300B to perform the method of FIG. 10. The method 1000 includes an operation 1001 for placing a substrate on a substrate support in exposure to a processing region. The method 1000 also includes an operation 1003 for generating a plasma in a plasma generation region separate from the processing region. The method 1000 also includes an operation 1005 for supplying reactive constituents of the plasma from the plasma generation region through a plurality of fluid transmission pathways into the processing region, whereby the reactive constituents of the plasma affect processing of the substrate. The method 1000 further includes an operation 1007 for generating a supplemental plasma in the plurality of fluid transmission pathways. The method 1000 further includes an operation 1009 for supplying reactive constituents of the supplemental plasma from the plurality of fluid transmission pathways into the processing region, whereby the reactive constituents of the supplemental plasma affect processing of the substrate.

In one embodiment, generating the supplemental plasma in operation 1007 includes operating the plurality of fluid transmission pathways as either flow-through hollow cathodes, flow-through capacitively coupled regions, flow-through inductively coupled regions, flow-through magnetron driven regions, flow-through laser driven regions, or a combination thereof. Also, in one embodiment, generating the supplemental plasma in the plurality of fluid transmission pathways in operation 1007 includes transmitting direct current power, radiofrequency current power, or a combination of direct current power and radiofrequency power through the plurality of fluid transmission pathways. In one embodiment, the power is transmitted through the plurality of fluid transmission pathways in a pulsed manner. In another embodiment, the power is transmitted through the plurality of fluid transmission pathways in a continuous manner. Additionally, in one embodiment, generating the supplemental plasma in the plurality of fluid transmission pathways in operation 1007 includes supplying a process gas to the interior of each of the plurality of fluid transmission pathways.

In one embodiment, supplying reactive constituents of the plasma from the plasma generation region through the plurality of fluid transmission pathways into the processing region in operation 1005 includes operating an electrode disposed in the plasma generation region to drive charged species from the plasma generation region through the plurality of fluid transmission pathways into the processing region. Also, in one embodiment, supplying reactive constituents of the supplemental plasma from the plurality of fluid transmission pathways into the processing region in operation 1009 includes operating an extraction grid disposed within the processing chamber to attract charged species from the plurality of fluid transmission pathways into the processing region.

In one embodiment, the method 1000 can further include an operation for injecting electrons into the processing region over the substrate, whereby the injected electrons modify an ion density in the processing region to affect processing of the substrate. Also, in one embodiment, the method 1000 can include an operation for supplying power to one or more electrodes disposed within the processing region separate from the substrate support, whereby the power supplied to the one or more electrodes injects electrons from the one or more electrodes into the processing region so as to modify an ion density in the processing region to affect processing of the substrate.

While this invention has been described in terms of several embodiments, it will be appreciated that those skilled in the art upon reading the preceding specification and studying the drawings will realize various alterations, additions, permutations and equivalents thereof. The present invention includes all such alterations, additions, permutations, and equivalents as fall within the true spirit and scope of the invention.

What is claimed is:

1. A semiconductor substrate processing system, comprising:
   a processing chamber;
   a substrate support defined to support a substrate in the processing chamber;
   a plasma chamber defined separate from the processing chamber, the plasma chamber defined to generate a plasma;

a top plate disposed above the substrate support so as to separate the plasma chamber from the processing chamber;

a planar conductive segment disposed within the processing chamber separate from the substrate support, the planar conductive segment extending across a bottom surface of the top plate, the planar conductive segment positioned in an orientation facing the substrate support;

an insulating member formed and disposed between the planar conductive segment and the top plate to electrically isolate the planar conductive segment from the top plate and surrounding structures of the processing chamber;

a plurality of fluid transmission pathways formed through the top plate and the planar conductive segment and the insulating member so as to extend from the plasma chamber to the processing chamber;

a first power supply electrically connected to the planar conductive segment, the first power supply defined to supply electrical power to the planar conductive segment;

an electrode disposed within the plasma chamber across a top surface of the plasma chamber, the electrode oriented to drive charges species from the plasma chamber through the plurality of fluid transmission pathways into the processing chamber; and a second power supply electrically connected to the electrode, the second power supply defined to supply electrical power to the electrode.

2. A semiconductor substrate processing system as recited in claim 1, further comprising:
a conductive band disposed outside a perimeter of the substrate support and above the substrate support within the processing chamber.

3. A semiconductor substrate processing system as recited in claim 2, wherein the conductive band is formed as a continuous structure that circumscribes the perimeter of the substrate support.

4. A semiconductor substrate processing system as recited in claim 3, further comprising:
an insulating member formed and disposed around the conductive band to electrically isolate the conductive band from surrounding structures of the processing chamber.

5. A semiconductor substrate processing system as recited in claim 1, wherein the planar conductive segment is disposed above and over the substrate support within the processing chamber.

6. A semiconductor substrate processing system as recited in claim 5, wherein the planar conductive segment is defined to cover a bottom surface of the top plate.

7. A semiconductor substrate processing system as recited in claim 6, wherein the insulating member physically contacts both the top plate and the planar conductive segment, and wherein the insulating member covers a top surface of the planar conductive segment.

8. A semiconductor substrate processing system as recited in claim 1, wherein the first power supply is defined to supply direct current power, radiofrequency power, or a combination of direct current power and radiofrequency power to the planar conductive segment.

9. A semiconductor substrate processing system as recited in claim 1, wherein the first power supply is defined to supply power to the planar conductive segment in either a pulsed manner or a continuous manner.

10. A semiconductor substrate processing system as recited in claim 2, further comprising:

a third power supply electrically connected to the conductive band, wherein the third power supply is independent from each of the first and second power supplies.

11. A method for processing a semiconductor substrate, comprising:
placing a substrate on a substrate support in exposure to a processing region within a processing chamber of a semiconductor substrate processing system, the semiconductor substrate processing system including—
a plasma chamber defined separate from the processing chamber, the plasma chamber defined to generate a plasma,
a top plate disposed above the substrate support so as to separate the plasma chamber from the processing chamber,
a planar conductive segment disposed within the processing chamber separate from the substrate support, the planar conductive segment extending across a bottom surface of the top plate, the planar conductive segment positioned in an orientation facing the substrate support,
an insulating member formed and disposed between the planar conductive segment and the top plate to electrically isolate the planar conductive segment from the top plate and surrounding structures of the processing chamber,
a plurality of fluid transmission pathways formed through the top plate and the planar conductive segment and the insulating member so as to extend from the plasma chamber to the processing chamber, and
a first power supply electrically connected to the planar conductive segment, the first power supply defined to supply electrical power to the planar conductive segment,
an electrode disposed within the plasma chamber across a top surface of the plasma chamber, the electrode oriented to drive charges species from the plasma chamber through the plurality of fluid transmission pathways into the processing chamber, and
a second power supply electrically connected to the electrode, the second power supply defined to supply electrical power to the electrode;
generating the plasma in the plasma chamber separate from the processing region;
supplying reactive constituents of the plasma from the plasma chamber through the plurality of fluid transmission pathways to the processing region; and
supplying power to the planar conductive segment disposed within the processing region separate from the substrate support, whereby the power supplied to the planar conductive segment injects electrons from the planar conductive segment into the processing region so as to modify an ion density in the processing region to affect processing of the substrate.

12. A method for processing a semiconductor substrate as recited in claim 11, wherein the semiconductor substrate processing system includes a conductive band disposed outside a perimeter of the substrate support and above the substrate support in exposure to the processing region, and wherein the method includes supplying power to the conductive band so as to inject electrons from the conductive band into the processing region.

13. A method for processing a semiconductor substrate as recited in claim 12, wherein the conductive band is formed as a continuous structure that circumscribes the perimeter of the substrate support.

14. A method for processing a semiconductor substrate as recited in claim 11, wherein the planar conductive segment is disposed above and over the substrate support in exposure to the processing region.

15. A method for processing a semiconductor substrate as recited in claim 11, wherein supplying power to the planar conductive segment includes supplying direct current power, radiofrequency power, or a combination of direct current power and radiofrequency power to the planar conductive segment.

16. A method for processing a semiconductor substrate as recited in claim 11, wherein the power is supplied to the planar conductive segment in a pulsed manner.

17. A method for processing a semiconductor substrate as recited in claim 11, wherein the power is supplied to the planar conductive segment in a continuous manner.

18. A method for processing a semiconductor substrate as recited in claim 11, wherein supplying power to the planar conductive segment includes alternating a polarity of electric charge on the planar conductive segment.

19. A method for processing a semiconductor substrate as recited in claim 11, further comprising:
   applying a bias voltage across the processing region from the substrate support so as to attract ions that are generated as a result of the injected electrons toward the substrate on the substrate support.

* * * * *